United States Patent
Yi et al.

(10) Patent No.: US 12,374,402 B2
(45) Date of Patent: Jul. 29, 2025

(54) SMART EARLY PROGRAM TERMINATION ALGORITHM FOR NEIGHBOR PLANE DISTURB COUNTERMEASURE

(71) Applicant: Western Digital Technologies, Inc., San Jose, CA (US)

(72) Inventors: Dandan Yi, Shangai (CN); Xuan Tian, Shanghai (CN); Liang Li, Shanghai (CN); Vincent Yin, Shanghai (CN)

(73) Assignee: Sandisk Technologies, Inc., Milpitas, CA (US)

( * ) Notice: Subject to any disclaimer, the term of this patent is extended or adjusted under 35 U.S.C. 154(b) by 173 days.

(21) Appl. No.: 18/229,978

(22) Filed: Aug. 3, 2023

(65) Prior Publication Data
US 2024/0386962 A1  Nov. 21, 2024

Related U.S. Application Data

(60) Provisional application No. 63/466,875, filed on May 16, 2023.

(51) Int. Cl.
| | |
|---|---|
| *G11C 16/10* | (2006.01) |
| *G11C 16/04* | (2006.01) |
| *G11C 16/08* | (2006.01) |
| *G11C 16/34* | (2006.01) |
| *H10B 43/27* | (2023.01) |
| *H10B 43/35* | (2023.01) |

(52) U.S. Cl.
CPC .......... *G11C 16/10* (2013.01); *G11C 16/0483* (2013.01); *G11C 16/08* (2013.01); *G11C 16/3427* (2013.01); *G11C 16/3459* (2013.01); *H10B 43/27* (2023.02); *H10B 43/35* (2023.02)

(58) Field of Classification Search
CPC .......... G11C 16/10; G11C 16/34; G11C 16/24
See application file for complete search history.

(56) References Cited

U.S. PATENT DOCUMENTS

| | | |
|---|---|---|
| 11,538,538 B1 | 12/2022 | Tian |
| 2019/0121725 A1* | 4/2019 | Sehgal ................... G11C 16/10 |

* cited by examiner

*Primary Examiner* — Jason Lappas
(74) *Attorney, Agent, or Firm* — Dickinson Wright PLLC

(57) ABSTRACT

A memory apparatus and method of operation are provided. The apparatus includes memory cells each connected to word lines and disposed in memory holes. The memory holes are arranged in rows comprising strings which are grouped into blocks comprising a first plane and a second plane. A control means is configured to program memory cells of the first plane and the second plane connected to one of the word lines using iterations of a program operation. The control means terminates programming of the first plane prior to completing programming of the first plane in response to determining the first plane programs slower than the second plane by a predetermined number of the iterations of the program operation. The control means adjusts the predetermined number of the iterations based on an additional verify iteration performed on at least some of the memory cells beyond the iterations of the program operation.

20 Claims, 20 Drawing Sheets

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

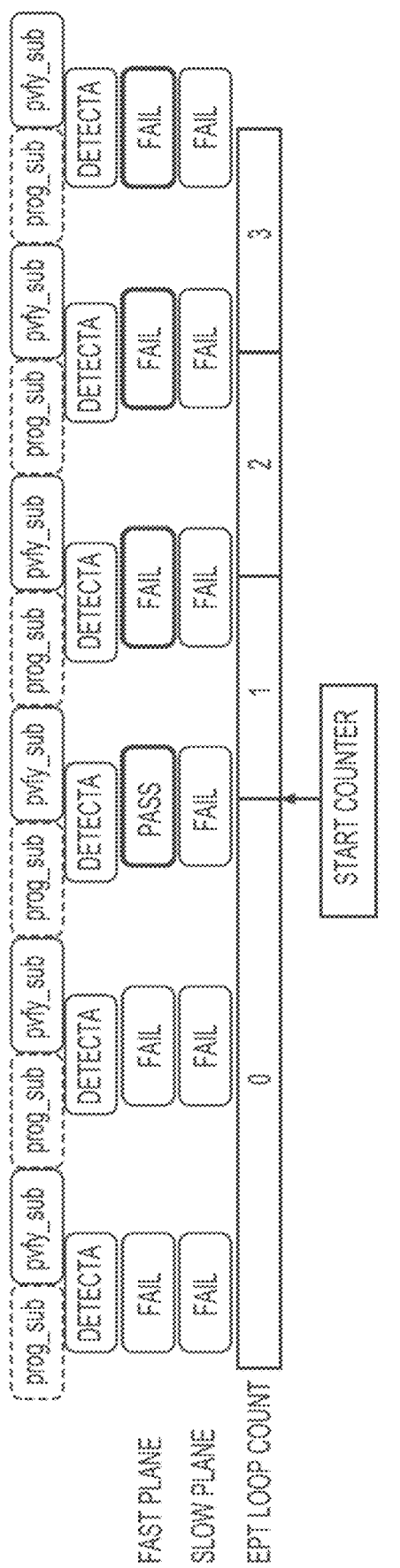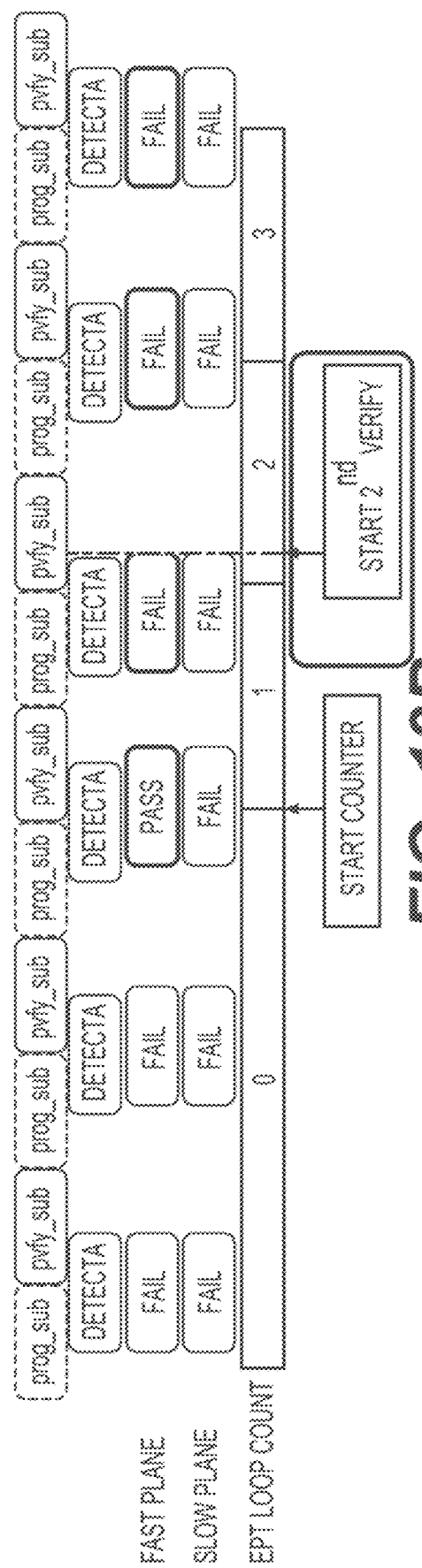

SMART EARLY PROGRAM TERMINATION ALGORITHM FOR NEIGHBOR PLANE DISTURB COUNTERMEASURE

CROSS-REFERENCE TO RELATED APPLICATIONS

This application claims the benefit of U.S. Provisional Application No. 63/466,875, filed on May 16, 2023. The entire disclosure of the application referenced above is incorporated herein by reference.

FIELD

This application relates to non-volatile memory apparatuses and the operation of non-volatile memory apparatuses.

BACKGROUND

This section provides background information related to the technology associated with the present disclosure and, as such, is not necessarily prior art.

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device (or other client). However, various challenges are presented in operating such memory systems. In particular, memory cells of the memory system may be arranged in multiple planes connected to the same word lines and programmed concurrently. However, certain word line defects on one plane may disturb programming of memory cells on the concurrently programmed planes and may lead to overprogramming. Thus, there is a need for improved memory apparatuses and methods of operation that overcome such challenges.

SUMMARY

This section provides a general summary of the present disclosure and is not a comprehensive disclosure of its full scope or all of its features and advantages.

An object of the present disclosure is to provide a memory apparatus and a method of operating the memory apparatus that address and overcome the above-noted shortcomings.

Accordingly, it is an aspect of the present disclosure to provide a memory apparatus including memory cells each connected to one of a plurality of word lines. The memory cells are disposed in memory holes and are configured to retain a threshold voltage corresponding to one of a plurality of data states. The memory holes are arranged in rows comprising a plurality of strings. The plurality of strings are grouped into a plurality of blocks comprising a first plane and a second plane. A control means is coupled to the plurality of word lines and the memory holes and is configured to program memory cells of the first plane and the second plane connected to one of the plurality of word lines using a plurality of iterations of a program operation. The control means is also configured to terminate programming of the first plane prior to completing programming of the first plane in response to determining the first plane programs slower than the second plane by a predetermined number of the plurality of iterations of the program operation. The control means is additionally configured to adjust the predetermined number of the plurality of iterations based on an additional verify iteration performed on at least some of the memory cells beyond the plurality of iterations of the program operation.

According to another aspect of the disclosure, a controller in communication with a memory apparatus including memory cells each connected to one of a plurality of word lines. The memory cells are disposed in memory holes and are configured to retain a threshold voltage corresponding to one of a plurality of data states. The memory holes are arranged in rows comprising a plurality of strings. The plurality of strings are grouped into a plurality of blocks comprising a first plane and a second plane. The controller is configured to instruct the memory apparatus to program memory cells of the first plane and the second plane connected to one of the plurality of word lines using a plurality of iterations of a program operation. The controller is also configured to instruct the memory apparatus to terminate programming of the first plane prior to completing programming of the first plane in response to determining the first plane programs slower than the second plane by a predetermined number of the plurality of iterations of the program operation. The controller adjusts the predetermined number of the plurality of iterations based on an additional verify iteration performed on at least some of the memory cells beyond the plurality of iterations of the program operation.

According to an additional aspect of the disclosure, a method of operating a memory apparatus is provided. The memory apparatus includes memory cells each connected to one of a plurality of word lines. The memory cells are disposed in memory holes and are configured to retain a threshold voltage corresponding to one of a plurality of data states. The memory holes are arranged in rows comprising a plurality of strings. The plurality of strings are grouped into a plurality of blocks comprising a first plane and a second plane. The method includes the step of programming memory cells of the first plane and the second plane connected to one of the plurality of word lines using a plurality of iterations of a program operation. In addition, the method includes the step of terminating programming of the first plane prior to completing programming of the first plane in response to determining the first plane programs slower than the second plane by a predetermined number of the plurality of iterations of the program operation. The method also includes the step of adjusting the predetermined number of the plurality of iterations based on an additional verify iteration performed on at least some of the memory cells beyond the plurality of iterations of the program operation.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIGS. 13A and 13B show two sequences of iterations of a program operation of a fast plane and a slow plane for a memory apparatus without the additional verify iteration and using the additional verify iteration according to aspects of the disclosure;

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
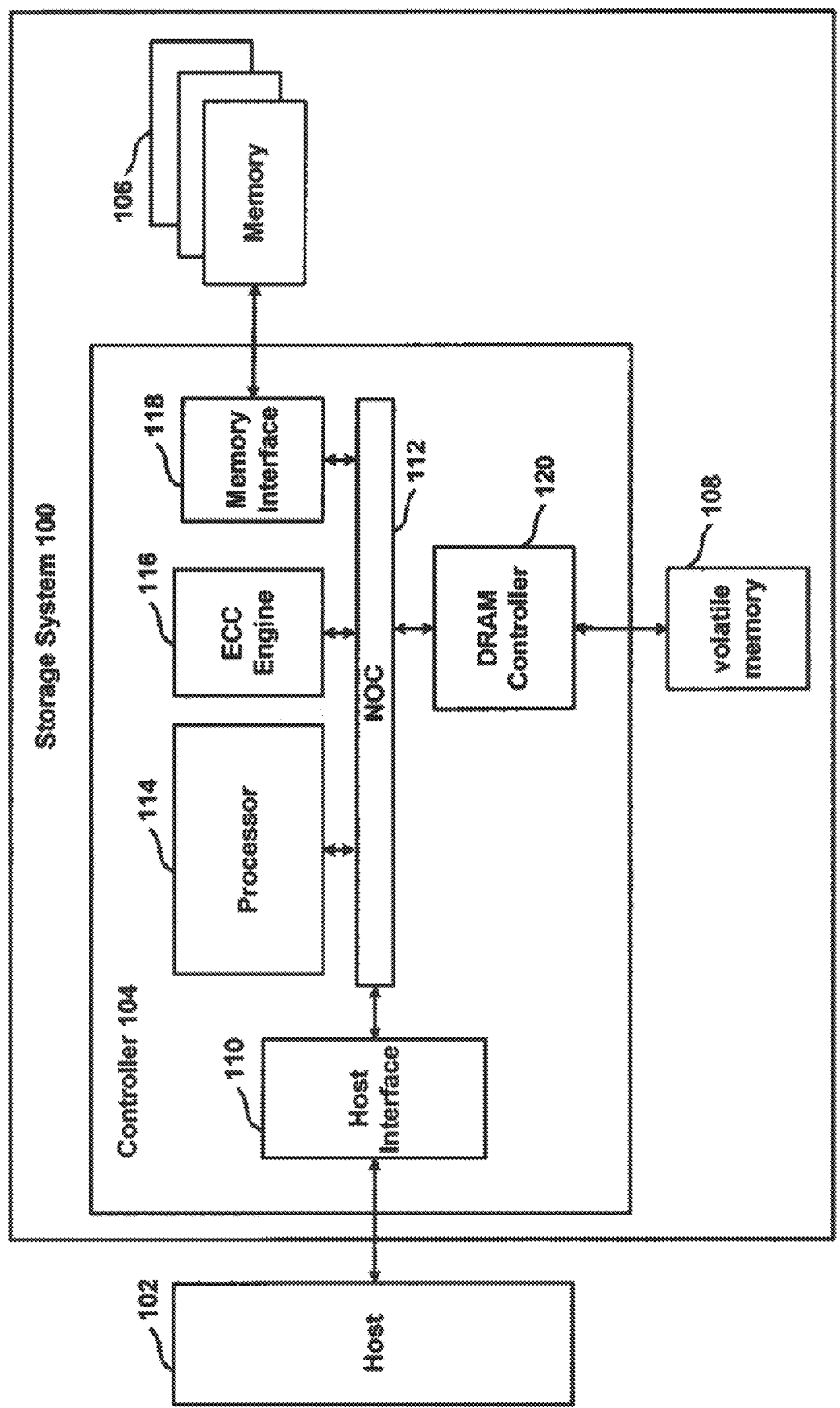
FIG. 1 is a block diagram depicting one embodiment of a memory system according to aspects of the disclosure.

In the following description, details are set forth to provide an understanding of the present disclosure. In some instances, certain circuits, structures and techniques have not been described or shown in detail in order not to obscure the disclosure.

In general, the present disclosure relates to non-volatile memory apparatuses of the type well-suited for use in many applications. The non-volatile memory apparatus and associated methods of operation of this disclosure will be described in conjunction with one or more example embodiments. However, the specific example embodiments disclosed are merely provided to describe the inventive concepts, features, advantages and objectives with sufficient clarity to permit those skilled in this art to understand and practice the disclosure. Specifically, the example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Some non-volatile memory devices are used to store two ranges of charges and, therefore, the memory cells can be programmed/erased between two data states: an erased state and a programmed state (corresponding to data "1" and data "0"). Such a device is referred to as a binary device or a single-level cell (SLC) and the data are binary data.

In contrast, a multi-state flash memory cell (storing multi-state data) is implemented by identifying multiple, distinct allowed threshold voltage ranges. Each distinct threshold voltage range corresponds to a predetermined value for the set of data bits. For example, some memory cells can store two or more bits. The specific relationship between the data programmed into the memory cell and the threshold voltage ranges of the memory cell depends upon the data encoding scheme adopted for the memory cells.

In addition to the gains in capacity resulting from multi-state memory architectures, significant advantages in memory technology have resulted from steadily scaling down the physical dimensions of memory cells. Smaller memory cells can be packed more densely on a given die area, allowing higher memory capacity for the same price as an older memory technology. However, scaling the sizes of memory cells entails certain risks.

Indeed, densely packing such smaller memory cells may result in increased manufacturing defects, such as shorting between adjacent word lines, shorting between word lines and interconnects, shorting between word lines and the substrate, and broken word lines. Such manufacturing defects often result in corruption of data stored on the word lines being programmed and nearby word lines.

In some cases, these manufacturing defects are not realized during tests conducted during manufacturing and prior to packaging and shipping the memory devices. Instead, such latent manufacturing defects may only begin to corrupt data after an end user begins programing and erasing the memory cells in such memory devices.

Some memory technologies seek to combat latent manufacturing defects by reading programmed data after programming or evaluating performance after completing programming. However, by the time programming has completed, the programming process may have already damaged data stored in other nearby memory cells.

In addition, some non-volatile memory devices include a multi-plane memory structure organization, and memory cells in the multiple planes connected to the same word lines may be programmed concurrently. Although multi-plane programming may increase programming speed, any defects such as the word line defects described above on one plane may disturb programming of memory cells on the concurrently programmed planes. One such disturb mechanism causes overprogramming of lower programmed states when implementing certain word line skip smart-verify algorithms. During programming, if a defect condition exists on one of the planes, it may be possible to terminate programming on the plane that includes the detected defect to reduce or eliminate program disturb on the other planes. Nevertheless, tradeoffs may still exist with tuning the number of program loops allowed before early program termination.

FIG. 1 is a block diagram of an embodiment of a memory system 100 that implements the described technology. In an embodiment, memory system 100 is a solid state drive ("SSD"). Memory system 100 also can be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 104 connected to one or more memory die 106 and local high speed volatile memory 108 (e.g., DRAM). The one or more memory die 106 each include a plurality of non-volatile memory cells. More information about the structure of each memory die 106 is provided below. Local high speed volatile memory 108 is used by controller 104 to perform certain functions. For example, local high speed volatile memory 108 stores logical to physical address translation tables ("L2P tables")

Controller 104 includes a host interface 110 that is connected to and in communication with host 102. In one embodiment, host interface 110 provides a PCIe interface. Other interfaces can also be used, such as SCSI, SATA, etc. Host interface 110 is also connected to a network-on-chip (NOC) 112, which is a communication subsystem on an integrated circuit. In other embodiments, NOC 112 can be replaced by a bus.

A NOC can span synchronous and asynchronous clock domains or use unclocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. In embodiments, the wires and the links of a NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges).

Connected to and in communication with NOC 112 is processor 114, ECC engine 116, memory interface 118, and DRAM controller 120. DRAM controller 120 is used to operate and communicate with local high speed volatile memory 108 (e.g., DRAM). In other embodiments, local high speed volatile memory 108 can be SRAM or another type of volatile memory.

ECC engine 116 performs error correction services. For example, ECC engine 116 performs data encoding and decoding, as per the implemented ECC technique. In one embodiment, ECC engine 116 is an electrical circuit programmed by software. For example, ECC engine 116 can be a processor that can be programmed. In other embodiments, ECC engine 116 is a custom and dedicated hardware circuit without any software. In another embodiment, the function of ECC engine 116 is implemented by processor 114.

Processor 114 performs the various controller memory operations, such as programming, erasing, reading, as well as memory management processes. In an embodiment, processor 114 is programmed by firmware. In other embodiments, processor 114 is a custom and dedicated hardware circuit without any software. In an embodiment, processor 114 also implements a translation module, as a software/firmware process or as a dedicated hardware circuit.

In many systems, non-volatile memory is addressed internally to the storage system using physical addresses associated with the one or more memory die. However, the host system will use logical addresses to address the various memory locations. This enables the host to assign data to consecutive logical addresses, while the storage system is free to store the data as it wishes among the locations of the one or more memory die. To enable this system, the controller (e.g., the translation module) performs address translation between the logical addresses used by the host and the physical addresses used by the memory dies.

One example implementation is to maintain tables (e.g., the L2P tables mentioned above) that identify a translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that local memory 108 cannot hold all of the L2P tables. In such a case, the entire set of L2P tables are stored in a memory die 106 and a subset of the L2P tables are cached (L2P cache) in the local high speed volatile memory 108.

In an embodiment, memory interface 118 communicates with one or more memory die 106. In an embodiment, memory interface 118 provides a Toggle Mode interface. Other interfaces also can be used. In some example implementations, memory interface 118 (or another portion of controller 104) implements a scheduler and buffer for transmitting data to and receiving data from one or more memory die.

Figure 2:
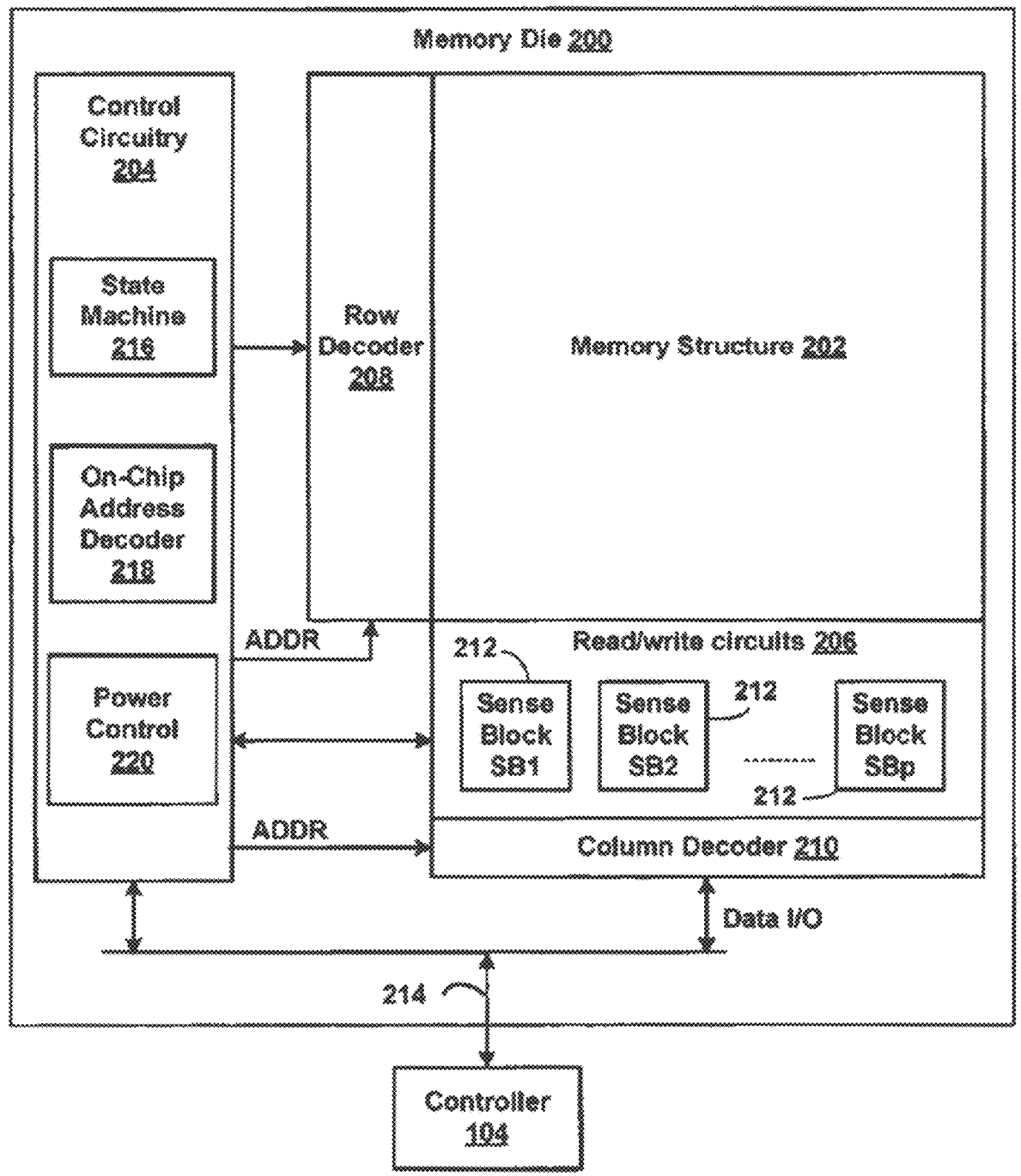
FIG. 2 is a block diagram of one embodiment of a memory die according to aspects of the disclosure.

FIG. 2 is a functional block diagram of one embodiment of a memory die 200. Each of the one or more memory die 106 of FIG. 1 can be implemented as memory die 200 of FIG. 2. The components depicted in FIG. 2 are electrical circuits. In an embodiment, each memory die 200 includes a memory structure 202, control circuitry 204, and read/write circuits 206. Memory structure 202 is addressable by word lines via a row decoder 208 and by bit lines via a column decoder 210.

In an embodiment, read/write circuits 206 include multiple sense blocks 212 including SB1, SB2, . . . , SBp (sensing circuitry) and allow a page (or multiple pages) of data in multiple memory cells to be read or programmed (written) in parallel. In an embodiment, each sense block 212 include a sense amplifier and a set of latches connected to the bit line. The latches store data to be written and/or data that has been read. In an embodiment, each sense amplifier 212 includes bit line drivers. In an embodiment, commands and data are transferred between controller 104 and memory die 200 via lines 214. In an embodiment, memory die 200 includes a set of input and/or output (I/O) pins that connect to lines 214.

In an embodiment, control circuitry 204 cooperates with read/write circuits 206 to perform memory operations (e.g., write, read, erase, and others) on memory structure 202. In an embodiment, control circuitry 204 includes a state machine 216, an on-chip address decoder 218, and a power control circuit 220. In an embodiment, state machine 216 provides die-level control of memory operations. In an embodiment, state machine 216 is programmable by software. In other embodiments, state machine 216 does not use software and is completely implemented in hardware (e.g., electrical circuits). In some embodiments, state machine 216 can be replaced by a microcontroller or microprocessor. In an embodiment, control circuitry 204 includes buffers such as registers, ROM fuses and other storage devices for storing default values such as base voltages and other parameters.

On-chip address decoder 218 provides an address interface between addresses used by controller 104 to the hardware address used by row decoder 208 and column decoder 210. Power control module 220 controls the power and voltages supplied to the word lines and bit lines during memory operations. Power control module 220 may include charge pumps for creating voltages.

For purposes of this document, control circuitry 204, read/write circuits 206, row decoder 208 and column decoder 210 comprise a control circuit for memory structure 202. In other embodiments, other circuits that support and operate on memory structure 202 can be referred to as a control circuit. For example, in some embodiments, controller 104 can operate as the control circuit or can be part of the control circuit. The control circuit also can be implemented as a microprocessor or other type of processor that is hardwired or programmed to perform the functions described herein.

For purposes of this document, control circuitry 204, read/write circuits 206, row decoder 208 and column decoder 210 comprise peripheral circuits for memory structure 202, as they are not part of memory structure 202 but are on the same die as memory structure 202 and are used to operate memory structure 202.

In an embodiment, memory structure 202 is a three dimensional memory array of non-volatile memory cells. In an embodiment, memory structure 202 is a monolithic three dimensional memory array in which multiple memory levels are formed above a single substrate, such as a wafer. The memory structure may be any type of non-volatile memory that is formed in one or more physical levels of arrays of memory cells having an active area disposed above a silicon (or other type of) substrate. In one example, the non-volatile memory cells of memory structure 202 include vertical NAND strings with charge-trapping material such as described. A NAND string includes memory cells connected by a channel.

In another embodiment, memory structure 202 includes a two dimensional memory array of non-volatile memory cells. In an example, the non-volatile memory cells are NAND flash memory cells utilizing floating gates. Other types of memory cells (e.g., NOR-type flash memory) also can be used.

The exact type of memory array architecture or memory cell included in memory structure 202 is not limited to the examples above. Many different types of memory array architectures or memory cell technologies can be used to form memory structure 202. No particular non-volatile memory technology is required for purposes of the new technology described herein.

Other examples of suitable technologies for memory cells of the memory structure 202 include ReRAM memories, magnetoresistive memory (MRAM), phase change memory (PCM), and the like. Examples of suitable technologies for architectures of memory structure 202 include two dimensional arrays, three dimensional arrays, cross-point arrays, stacked two dimensional arrays, vertical bit line arrays, and the like.

One example of a cross point memory includes reversible resistance-switching elements arranged in cross point arrays accessed by X lines and Y lines (e.g., word lines and bit lines). In another embodiment, the memory cells may include conductive bridge memory elements. A conductive bridge memory element also may be referred to as a programmable metallization cell.

A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of solid electrolyte between the two electrodes.

MRAM stores data using magnetic storage elements. The magnetic storage elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—$Sb_2Te_3$ super lattice to achieve non-thermal phase changes by simply changing the coordination state of Germanium atoms with a laser pulse (or light pulse from another source). Therefore, the doses of programming are laser pulses. The memory cells can be inhibited from programming by blocking the memory cells from receiving the light.

A person of ordinary skill in the art will recognize that the technology described herein is not limited to a single specific memory structure, but covers many relevant memory structures within the scope of the technology as described herein and as understood by one of ordinary skill in the art.

Figure 3:
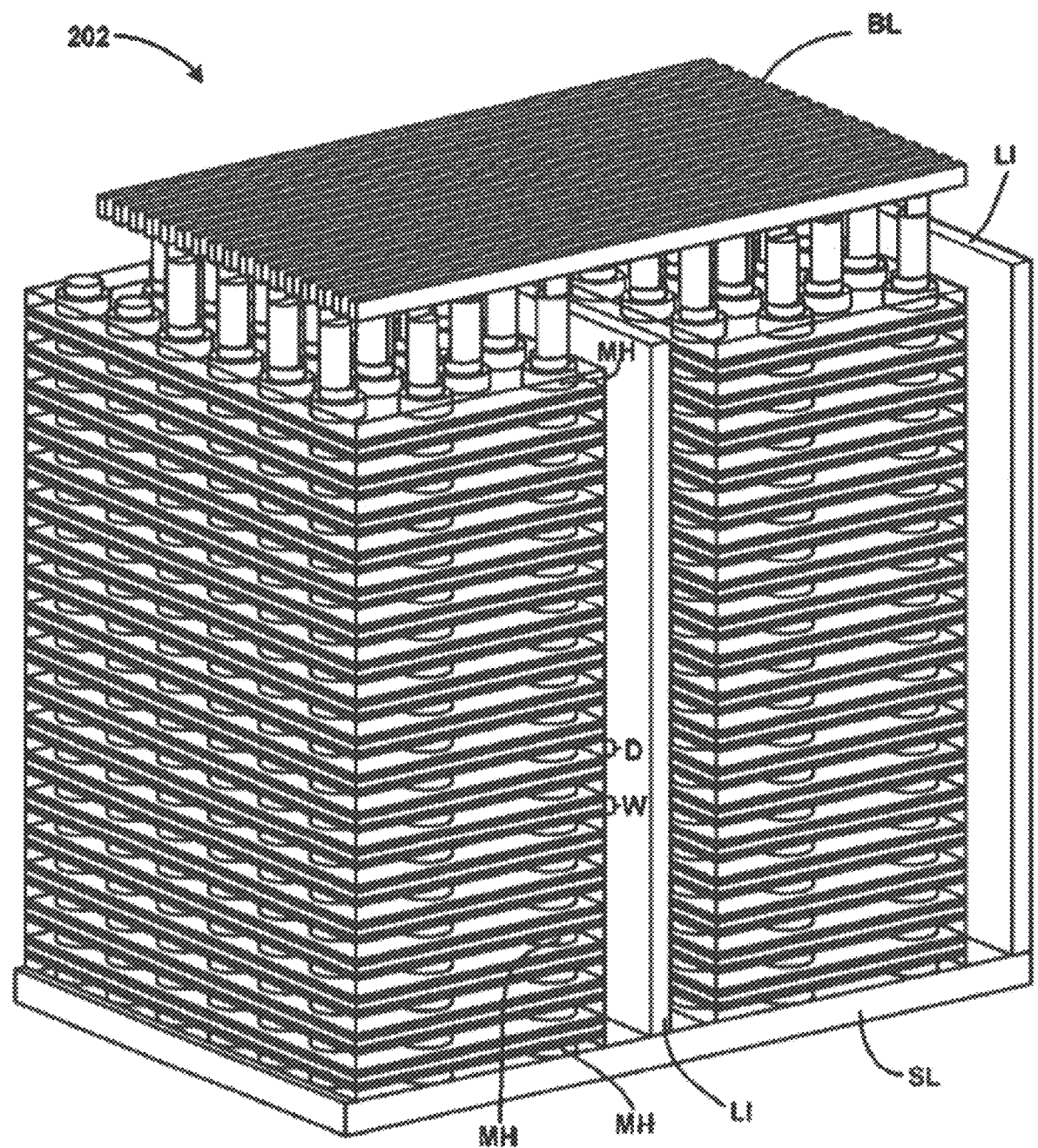
FIG. 3 is a perspective view of a portion of one embodiment of a three dimensional memory structure according to aspects of the disclosure.

FIG. 3 is a perspective view of a portion of an embodiment of a three dimensional memory array that includes memory structure 202. In an embodiment, memory structure 202 includes multiple non-volatile memory cells. For example, FIG. 3 shows a portion of one block of memory cells. The structure depicted includes a set of bit lines BL positioned above a stack of alternating dielectric layers and conductive layers. For example purposes, one of the dielectric layers is marked as D and one of the conductive layers (also called word line layers) is marked as W.

The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers also can be used. In an embodiment, the alternating dielectric layers and conductive layers are divided into four regions by local interconnects LI. FIG. 3 shows two regions and two local interconnects LI.

A source line layer SL is below the alternating dielectric layers and word line layers. Memory holes are formed in the stack of alternating dielectric layers and conductive layers. For example, one of the memory holes is marked as MH. Note that in FIG. 3 the dielectric layers are depicted as see-through so that the reader can see the memory holes positioned in the stack of alternating dielectric layers and conductive layers.

In an embodiment, NAND strings are formed by filling the memory hole with materials including a charge-trapping material to create a vertical column of memory cells (also referred to as a memory column). In an embodiment, each memory cell can store one or more bits of data. In an embodiment, each memory hole MH is associated with and coupled to a corresponding one of bit lines BL. In an embodiment, each bit line BL is coupled to one or more memory holes MH. More details of a three dimensional memory array that comprises memory structure 202 is provided below with respect to FIG. 4A-4F.

Figure 4A:
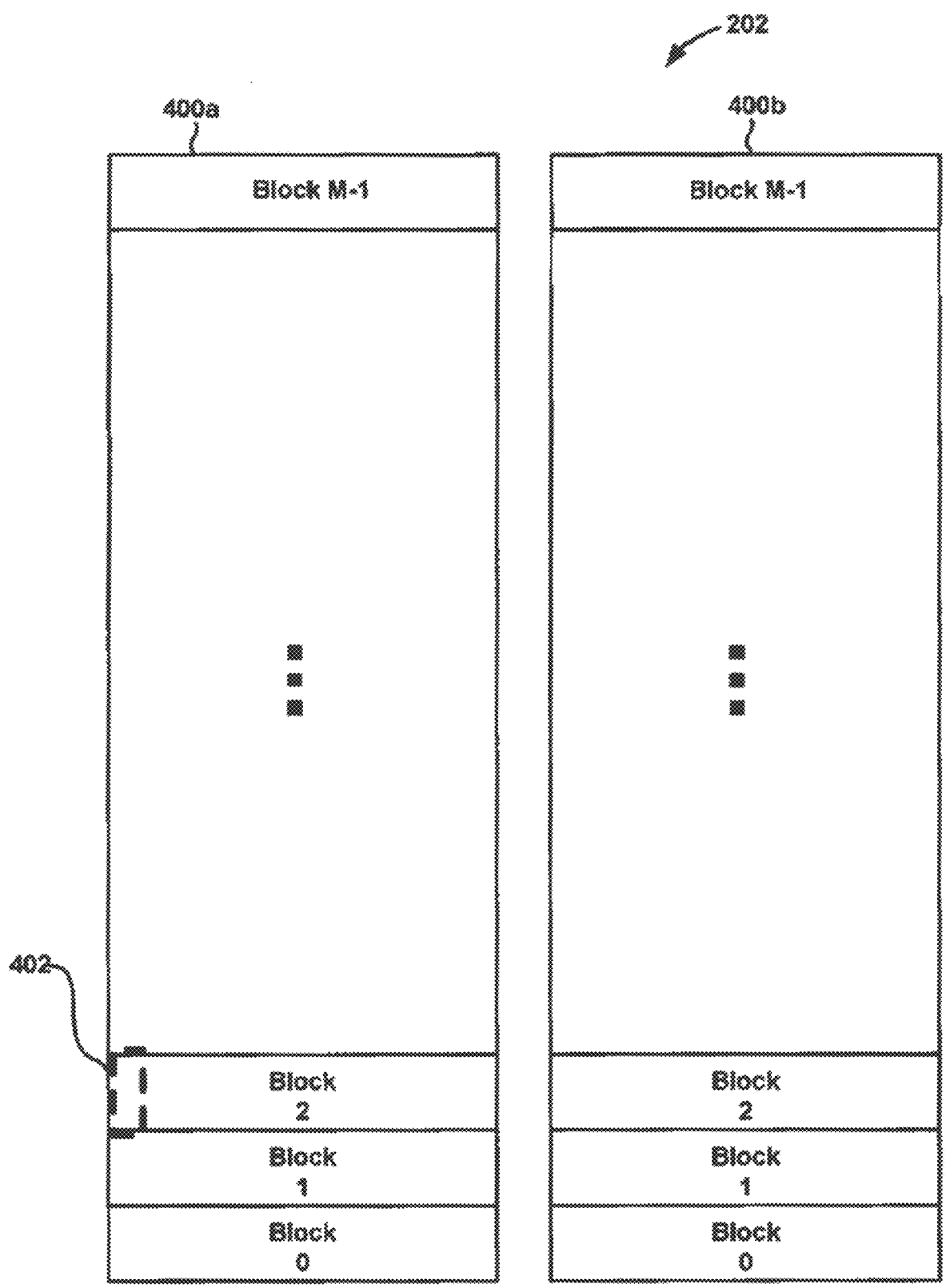
FIG. 4A is a block diagram of a memory structure having two planes according to aspects of the disclosure.

FIG. 4A is a block diagram explaining one example organization of memory structure 202, which is divided into two planes 400 a and 400 b. Both planes are on the same memory die 200 (FIG. 2). Each plane is then divided into M blocks. In one example, each plane has about 2000 blocks. However, different numbers of blocks and planes also can be used. A portion 402 of block 2 of memory plane 400 a is shown in dashed line in FIG. 4A.

In an embodiment, a block of memory cells is a unit of erase. That is, all memory cells of a block are erased together. In other embodiments, memory cells can be grouped into blocks for other reasons, such as to organize memory structure 202 to enable the signaling and selection circuits. In some embodiments, a block represents a group of connected memory cells as the memory cells of a block share a common set of word lines. Although FIG. 4A shows two planes on the same die, in other embodiments more than two planes can be implemented. For example, memory structure 202 can include 2-8 (or more) planes.

Figure 4B:
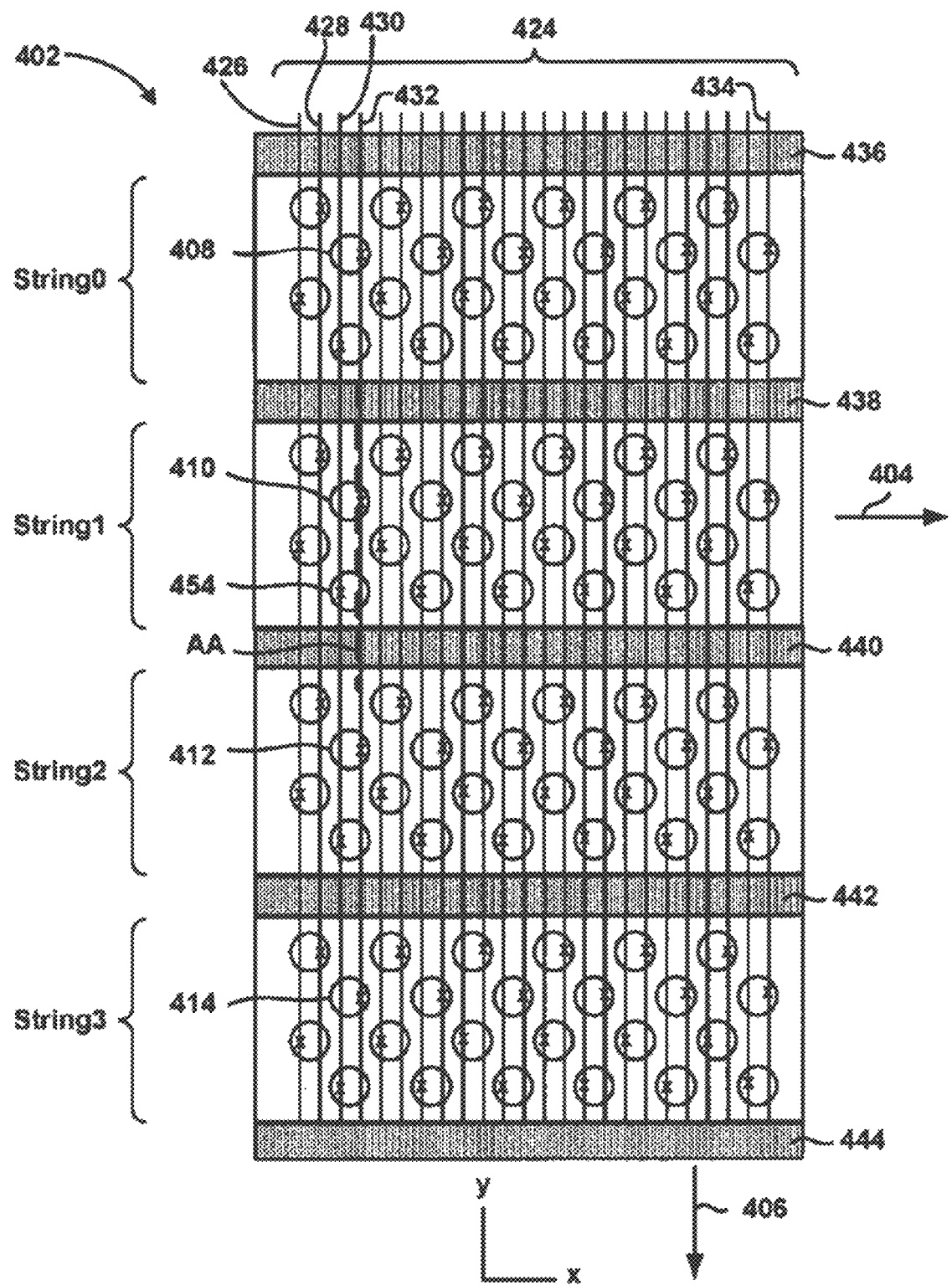
FIG. 4B depicts a top view of a portion of a block of memory cells according to aspects of the disclosure.

FIGS. 4B-4F depict an example three dimensional ("3D") NAND structure that corresponds to the structure of FIG. 3. FIG. 4B is a block diagram depicting a top view of portion 402 (FIG. 4A) of memory structure 202. As can be seen from FIG. 4B, portion 402 extends in direction 404 and direction 406. In an embodiment, the memory array has many layers, however, FIG. 4B only shows the top layer.

FIG. 4B depicts a plurality of circles that represent the memory holes, which are also referred to as memory columns. For example, FIG. 4B depicts memory holes 408, 410, 412 and 414. Each of the memory holes include multiple select transistors (also referred to as a select gate or selection gate) and multiple memory cells. In an embodiment, each memory hole implements a NAND string. Because portion 402 extends in directions 404 and 406, the block includes more memory holes than depicted in FIG. 4B.

FIG. 4B also depicts a set of bit lines 424, including bit lines 426, 428, 430, 432, . . . 434. In an embodiment, each memory hole is associated with and coupled to a corresponding one of the bit lines. In an embodiment, each bit line is coupled to one or more memory holes. FIG. 4B shows twenty four bit lines because only a portion of the block is depicted. It is contemplated that more than twenty four bit lines are connected to memory holes of the block. Each of the circles representing a memory hole has an "x" to indicate its connection to one bit line. For example, bit line 432 is connected to memory holes 408, 410, 412 and 414.

Portion 402 depicted in FIG. 4B includes a set of local interconnects 436, 438, 440, 442 and 444 that connect the various layers to a source line below the memory holes. Local interconnects 436, 438, 440, 442 and 444 also serve to divide each layer of the block into four regions. For example, the top layer depicted in FIG. 4B is divided into four regions designated as String0, String1, String2 and String3. In the layers of the block that implement memory cells, String0, String1, String2 and String3 also may be referred to as word line fingers that are separated by the local interconnects.

In an embodiment, the word line fingers on a common level of a block connect together to form a single word line. In another embodiment, the word line fingers on the same level are not connected together. In an example implementation, a bit line connects to a single memory hole in each of String0, String1, String2 and String3. In that implementation, each block has sixteen rows of active columns and each bit line connects to four rows in each block.

In an embodiment, all four rows connected to a common bit line are connected to the same word line (via different word line fingers on the same level that are connected together). Therefore, the system uses the source side selection lines and the drain side selection lines to choose one (or another subset) of the four to be subjected to a memory operation (program, verify, read, and/or erase).

Although FIG. 4B shows four regions String0, String1, String2 and String3, each having four rows of memory holes, and sixteen rows of memory holes in a block, those exact numbers are an example implementation. Other embodiments may include more or less regions per block, more or less rows of memory holes per region and more or less rows of memory holes per block. FIG. 4B also shows the memory holes being staggered. In other embodiments, different patterns of staggering can be used. In some embodiments, the memory holes are not staggered.

Figure 4C:
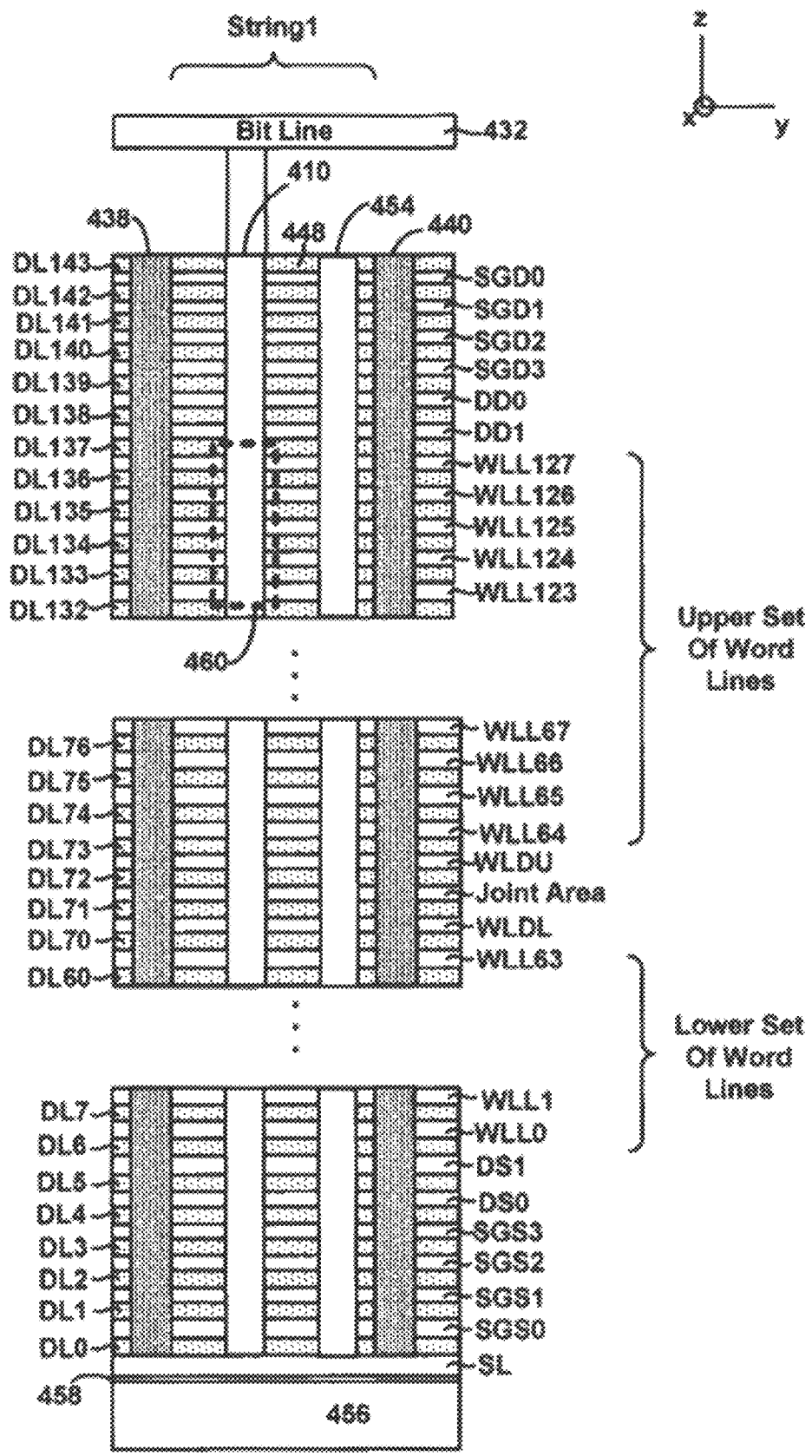
FIG. 4C depicts a cross sectional view of a portion of a block of memory cells according to aspects of the disclosure.

FIG. 4C depicts a portion of one embodiment of a three dimensional memory structure 202 showing a cross-sectional view along line AA of FIG. 4B. This cross sectional view cuts through memory holes 410 and 454 of String0 (see FIG. 4B). The structure of FIG. 4C includes four drain side select layers SGD0, SGD1, SGD2 and SGD3, four source side select layers SGS0, SGS1, SGS2 and SGS3, six dummy word line layers DD0, DD1, DS0, DS1, WLDL, WLDU, and one hundred and twenty eight data word line layers WLL0-WLL127 for connecting to memory cells. Other embodiments can implement more or less than four drain side select layers, more or less than four source side select layers, more or less than six dummy word line layers, and more or less than one hundred and twenty eight word lines.

Memory holes 410 and 454 are depicted protruding through the drain side select layers, source side select layers, dummy word line layers and word line layers. In one embodiment, each memory hole includes a vertical NAND string. Below the memory holes and the layers listed below is substrate 456, an insulating film 458 on the substrate, and source line SL. The NAND string of memory hole 410 has a source end at a bottom of the stack and a drain end at a top of the stack. As in agreement with FIG. 4B, FIG. 4C shows memory hole 410 connected to bit line 432 via connector 460. Local interconnects 438 and 440 also are depicted.

For ease of reference, drain side select layers SGD0, SGD1, SGD2 and SGD3, source side select layers SGS0, SGS1, SGS2 and SGS3, dummy word line layers DD0, DD1, DS0, DS1, WLDL and WLDU, and word line layers WLL0-WLL127 collectively are referred to as the conductive layers. In an embodiment, the conductive layers are made from a combination of TiN and tungsten. In other embodiments, other materials can be used to form the conductive layers, such as doped polysilicon, metal such as tungsten or metal silicide. In some embodiments, different conductive layers can be formed from different materials.

Between conductive layers are dielectric layers DL0-DL143. For example, dielectric layer DL136 is above word line layer WLL126 and below word line layer WLL127. In an embodiment, the dielectric layers are made from $SiO_2$. In other embodiments, other dielectric materials can be used to form the dielectric layers.

The non-volatile memory cells are formed along memory holes which extend through alternating conductive and dielectric layers in the stack. In an embodiment, the memory cells are arranged in NAND strings. The word line layers WLL0-WLL127 connect to memory cells (also called data memory cells). Dummy word line layers DD0, DD1, DS0, DS1, WLDL and WLDU connect to dummy memory cells. A dummy memory cell does not store and is not eligible to store host data (data provided from the host, such as data from a user of the host), while a data memory cell is eligible to store host data.

In some embodiments, data memory cells and dummy memory cells may have a same structure. A dummy word line is connected to dummy memory cells. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4C also shows a "Joint Area." In an embodiment it is expensive and/or challenging to etch one hundred and twenty-eight word line layers intermixed with dielectric layers. To ease this burden, one embodiment includes laying down a first stack of sixty four word line layers alternating with dielectric layers, laying down the Joint Area, and laying down a second stack of sixty four word line layers alternating with dielectric layers. The Joint Area is positioned between the first stack and the second stack. The Joint Area is used to connect the first stack to the second stack.

In FIG. 4C, the first stack is labeled as the "Lower Set of Word Lines" and the second stack is labeled as the "Upper Set of Word Lines." In an embodiment, the Joint Area is made from the same materials as the word line layers. In one example set of implementations, the plurality of word lines (control lines) comprises a first stack of alternating word line layers and dielectric layers, a second stack of alternating word line layers and dielectric layers, and a joint area between the first stack and the second stack, as depicted in FIG. 4C.

Figure 4D:
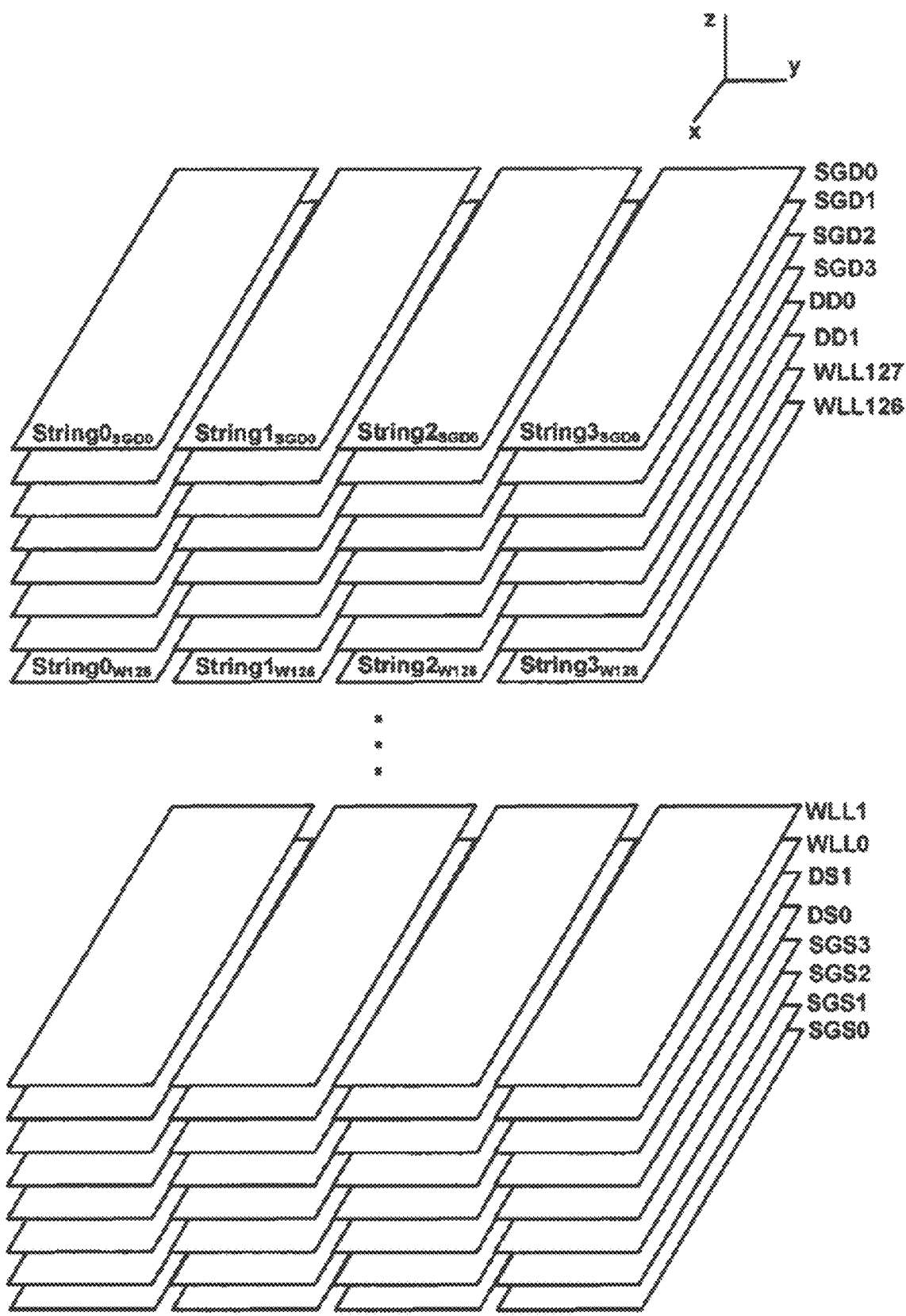
FIG. 4D depicts a view of the select gate layers and word line layers according to aspects of the disclosure.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in an embodiment local interconnects 436, 438, 440, 442 and 444 break up the conductive layers into four regions/fingers.

For example, word line layer WLL126 is divided into regions String0$_{W126}$, String1$_{W126}$, String2$_{W126}$ and String3$_{W126}$. In an embodiment, the four word line fingers on a same level are connected together. In another embodiment, each word line finger operates as a separate word line.

Likewise, drain side select gate layer SGD0 (the top layer) is divided into regions String0$_{SGD0}$, String1$_{SGD0}$, String2$_{SGD0}$ and String3$_{SGD0}$, also known as fingers or select line fingers. In an embodiment, the four select line fingers on a same level are connected together. In another embodiment, each select line finger operates as a separate word line.

Figure 4E:
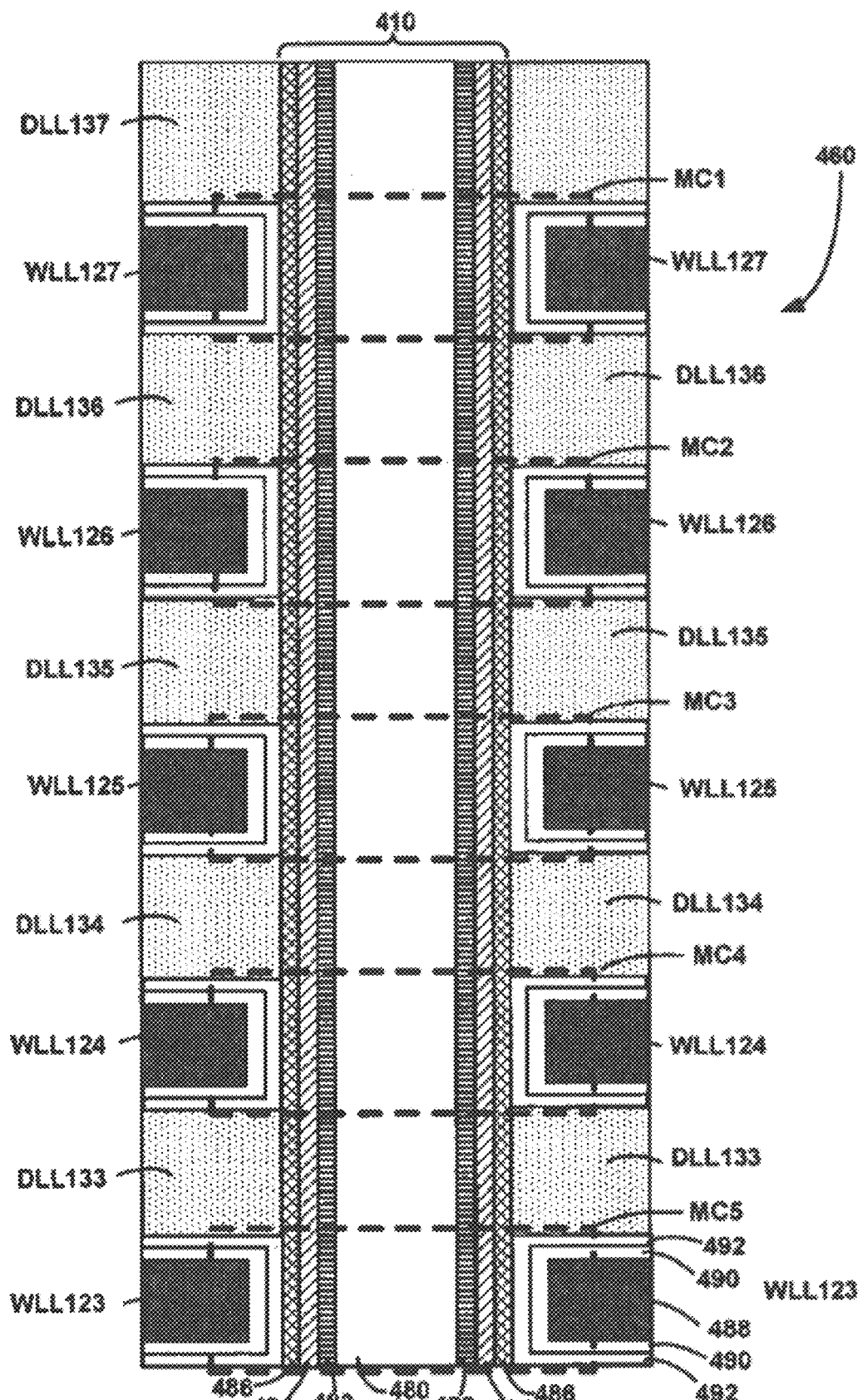
FIG. 4E is a cross sectional view of a memory hole of memory cells according to aspects of the disclosure.

FIG. 4E depicts a cross sectional view of String1 of FIG. 4C that includes a portion of memory hole 410. In an embodiment, the memory holes (e.g., memory hole 410) are shaped as cylinders. In other embodiment, however, memory holes may have other shapes. In an embodiment, memory hole 410 includes an inner core layer 480, a channel 482 surrounding inner core layer 480, a tunneling dielectric 484 surrounding channel 482, and a charge trapping layer 486 surrounding tunneling dielectric 484. In an embodiment, inner core layer 480 a dielectric material (e.g., $SiO_2$), channel 482 is polysilicon, tunneling dielectric 484 has an ONO structure, and charge trapping layer 486 is silicon nitride. Other memory materials and structures can also be used. The technology described herein is not limited to any particular material or structure.

FIG. 4E depicts dielectric layers DLL137, DLL136, DLL135, DLL134 and DLL133, as well as word line layers WLL127, WLL126, WLL125, WLL124, and WLL123. In an embodiment, each of the word line layers includes a word line region 488 surrounded by an aluminum oxide layer 490, which is surrounded by a blocking oxide ($SiO_2$) layer 492. The physical interaction of the word line layers with the memory hole forms the memory cells. Thus, a memory cell, in an embodiment, includes channel 482, tunneling dielectric 484, charge trapping layer 486, blocking oxide layer 492, aluminum oxide layer 490 and word line region 488.

For example, word line layer WLL127 and a portion of memory hole 410 comprise a memory cell MC1. Word line layer WLL126 and a portion of memory hole 410 comprise a memory cell MC2. Word line layer WLL125 and a portion of memory hole 410 comprise a memory cell MC3. Word line layer WLL124 and a portion of memory hole 410 comprise a memory cell MC4. Word line layer WLL123 and a portion of memory hole 410 comprise a memory cell MC5. In other architectures, a memory cell may have a different structure; however, the memory cell would still be the storage unit.

In an embodiment, when a memory cell is programmed, electrons are stored in a portion of the charge trapping layer 486 which is associated with the memory cell. These electrons are drawn into the charge trapping layer 486 from the channel 482, through the tunneling dielectric 484, in response to an appropriate voltage on word line region 488. The threshold voltage (Vth) of a memory cell is increased in proportion to the amount of stored charge.

In an embodiment, programming a memory cell is achieved through Fowler-Nordheim tunneling of the electrons into charge trapping layer 486. During an erase operation, the electrons return to channel 482 or holes are injected into charge trapping layer 486 to recombine with electrons. In an embodiment, erasing is achieved using hole injection into charge trapping layer 486 via a physical mechanism such as gate induced drain leakage (GIDL).

Figure 4F:
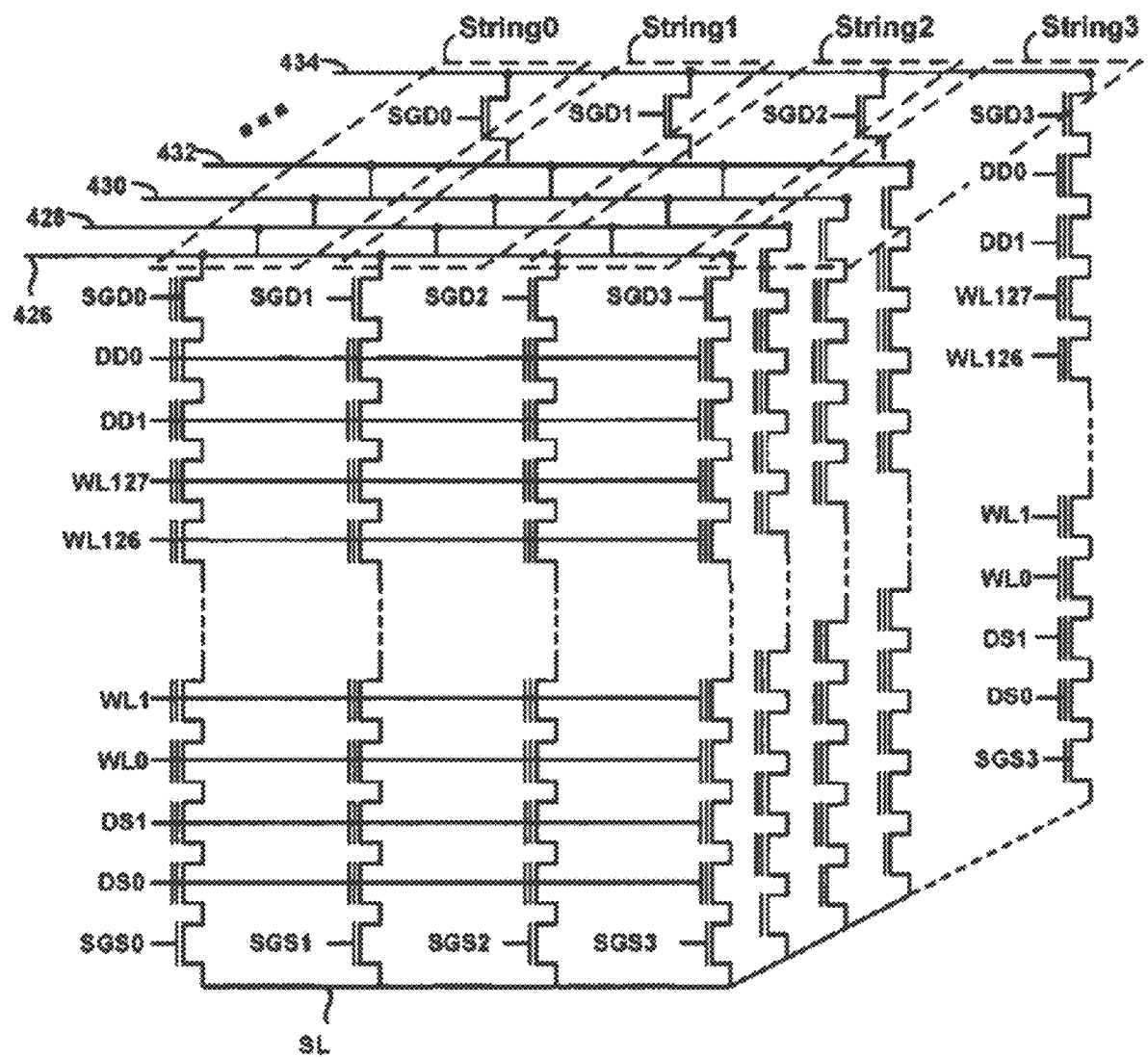
FIG. 4F is a schematic of a plurality of NAND strings according to aspects of the disclosure.

FIG. 4F is a schematic diagram of corresponding to portion 402 in Block 2 of FIGS. 4A-E, including bit lines 426, 428, 430, 432, . . . 434, and word lines WLL0-WLL127. Within the block, each bit line is connected to four NAND strings. Drain side selection lines SGD0, SGD1, SGD2 and SGD3 are used to determine which of the four NAND strings connect to the associated bit line(s). Source side selection lines SGS0, SGS1, SGS2 and SGS3 are used to determine which of the four NAND strings connect to the common source line.

During any given memory operation, a subset of the memory cells will be identified to be subjected to one or more parts of the memory operation. These memory cells identified to be subjected to the memory operation are referred to as selected memory cells. Memory cells that have not been identified to be subjected to the memory operation are referred to as unselected memory cells. Depending on the memory architecture, the memory type, and the memory operation, unselected memory cells may be actively or passively excluded from being subjected to the memory operation.

During a memory operation some word lines are referred to as selected word lines because they are connected to selected memory cells. Unselected word lines are not connected to selected memory cells. Similarly, selected bit lines are connected to selected memory cells and unselected bit lines are not connected to selected memory cells.

Although the example memory system of FIG. 3 and FIGS. 4A-4F is a three dimensional memory structure that includes vertical NAND strings with charge-trapping material, other (2D and 3D) memory structures also can be used with the technology described herein.

Figures 5, 6:
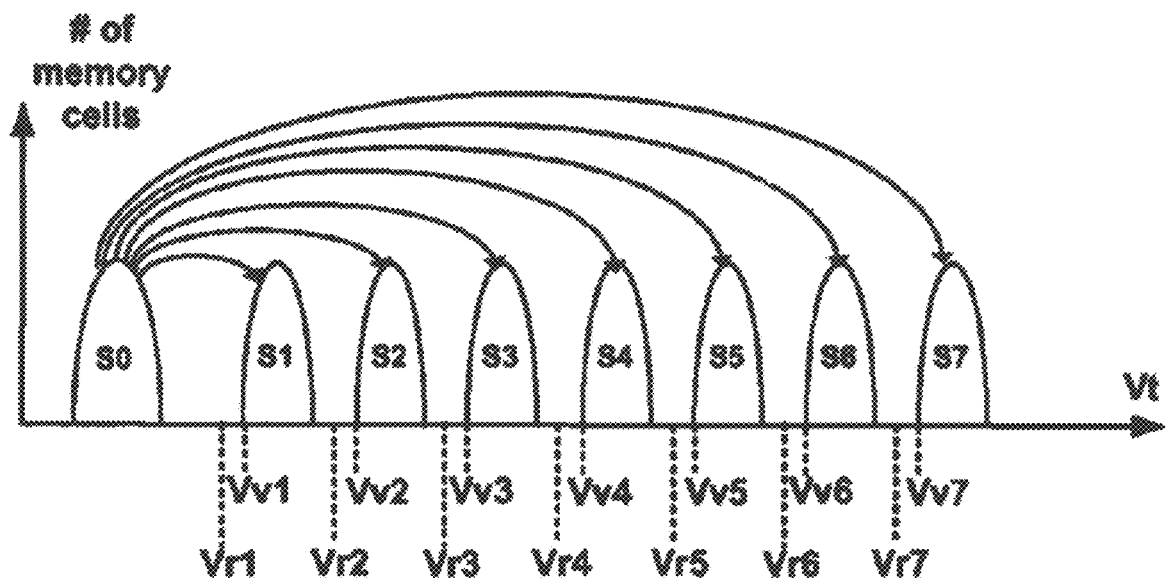
FIG. 5 depicts threshold voltage distributions according to aspects of the disclosure.
FIG. 6 is a table describing one example of an assignment of data values to data states according to aspects of the disclosure.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for a memory array when each memory cell stores three bits of data. Other embodiments, however, may use other data capacities per memory cell (e.g., such as one, two, four, or five bits of data per memory cell).

FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states.

Each threshold voltage distribution (data state) corresponds to predetermined values for the set of data bits. The specific relationship between the data programmed into a memory cell and the threshold voltage levels of the memory cell depends on the data encoding scheme adopted for the cells. In an embodiment, data values are assigned to the threshold voltage ranges using a Gray code assignment so that if the threshold voltage of a memory cell erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (S0, S1, S2, S3, . . . , S7) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In an embodiment, known as full sequence programming, memory cells can be programmed from the erased data state S0 directly to any of the programmed states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent full sequence programming.

The technology described herein also can be used with other types of programming in addition to full sequence programming (including, but not limited to, multiple stage/phase programming). In some embodiments, programmed states S1-S7 can overlap, with controller 104 (FIG. 1) relying on error correction to identify the correct data being stored.

FIG. 6 is a table describing an example assignment of data values to data states. In the table of FIG. 6, S0=111, S1=110, S2=100, S3=000, S4=010, S5=011, S6=001 and S7=101. Other encodings of data also can be used. No particular data encoding is required by the technology disclosed herein. In an embodiment, when a block is subjected to an erase operation, all memory cells are moved to data state S0, the erased state. In the embodiment of FIG. 6, all bits stored in a memory cell are "1" when the memory cell is erased (e.g., in data state S0).

Figure 7A:
FIGS. 7A-7E depict various threshold voltage distributions and describe a process for programming non-volatile memory according to aspects of the disclosure.
Figure 7B:
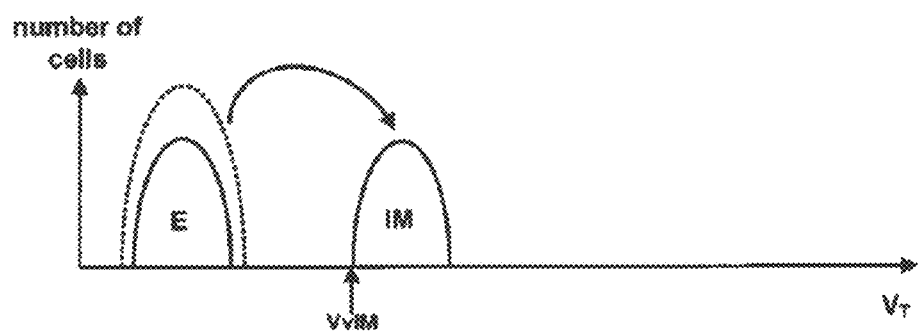

FIGS. 7A-7E illustrate a multi-phase programming approach. In this embodiment, the programming process includes three phases. Prior to programming, the memory cells are erased so that all memory cells connected to a common word line are in an erased threshold voltage distribution E, as depicted in FIG. 7A.

During the first programming phase, those memory cells whose targets (due to the data to be stored in those memory cells) are data states S4, S5, S6 or S7 are programmed to an intermediate threshold voltage distribution IM. Those memory cells are targeted for data states S0, S1, S2 or S3 remain in the erased threshold voltage distribution E. The first phase is graphically depicted in FIG. 7B. Memory cells being programmed to intermediate threshold voltage distribution IM are programmed to a target threshold voltage of VvIM.

During the second programming phase, those memory cells that are in the erased threshold voltage distribution E are programmed to their target data states. For example, those memory cells to be programmed to data state S3 are programmed from erased threshold voltage distribution E to data state S3, those memory cells to be programmed to data state S2 are programmed from erased threshold voltage distribution E to data state S2, those memory cells to be programmed to data state S1 are programmed from erase threshold voltage distribution E to data state S1, and those memory cells to be in data state S0 are not programmed during the second phase of the programming process. Thus, erased threshold voltage distribution E becomes data state S0.

Also, during the second programming phase, those memory cells that are in the intermediate state threshold voltage distribution IM are programmed to their target data states. For example, those memory cells to be programmed to data state S7 are programmed from intermediate threshold voltage distribution IM to data state S7, those memory cells to be programmed to data state S6 are programmed from intermediate threshold voltage distribution IM to data state S6, those memory cells to be programmed to data state S5 are programmed from intermediate threshold voltage distribution IM to data state S5, and those memory cells to be in data state S4 are programmed from intermediate threshold voltage distribution IM to data state S4. This second programming phase is illustrated in FIG. 7C.

Figure 7C:
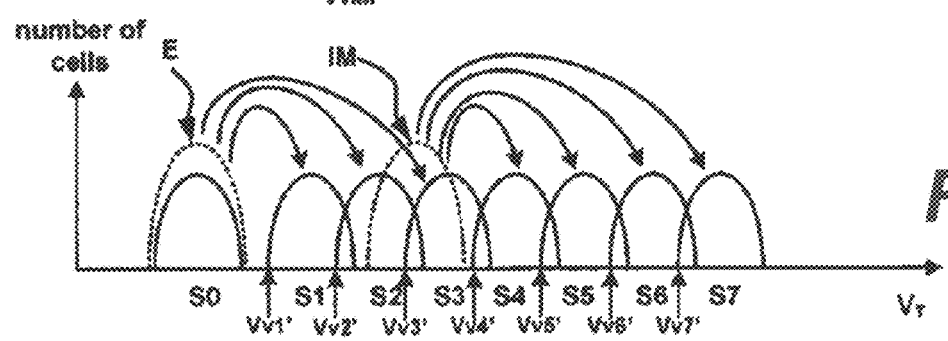
Figure 7D:
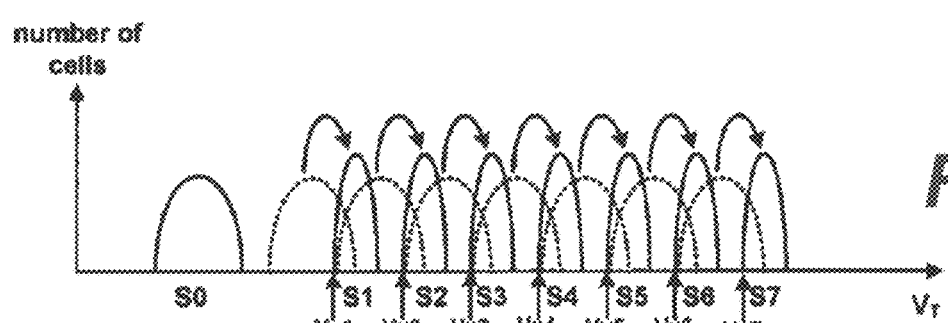

As can be seen in FIG. 7C, at the end of the second programming phase data states S1-S7 overlap with neighboring data states. For example, data state S1 overlaps with data state S2, data state S2 overlaps with data states S1 and S3, data state S3 overlaps with data states S2 and S4, data state S4 overlaps with data states S3 and S5, data state S5 overlaps with data states S4 and S6, and data state S6 overlaps with data states S5 and S7. In some embodiments, all or some of the data states do not overlap.

Figure 7E:
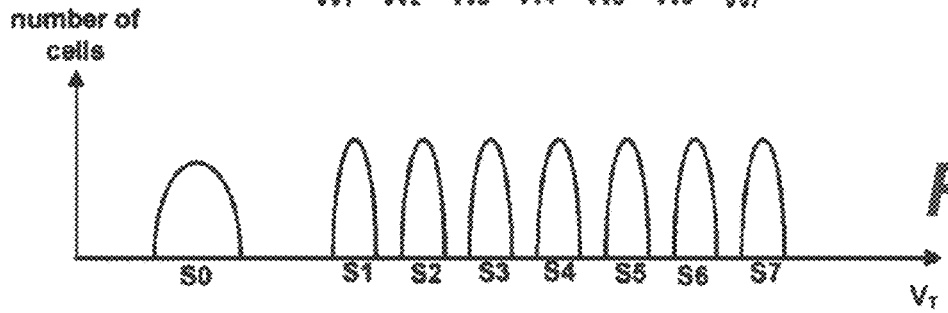

In the third programming phase, each of data states S1-S7 are tightened so that they no longer overlap with neighboring states. This is depicted graphically by FIG. 7D. The final result of the three phrase programming process is depicted in FIG. 7E, which shows data states S0-S7. In some embodiments, data state S0 is wider than data states S1-S7. In an embodiment, the data states of FIGS. 7A-7E may be encoded according to the table of FIG. 6.

In some embodiments, those memory cells to be programmed to data state S4 are not programmed during the second phase and, therefore, remain in intermediate threshold voltage distribution IM. During the third programming phase, the memory cells are programmed from intermediate threshold voltage distribution IM to S4. In other embodiments, memory cells destined for other states can also remain in intermediate threshold voltage distribution IM or erase threshold voltage distribution E during the second phase.

Figure 8:
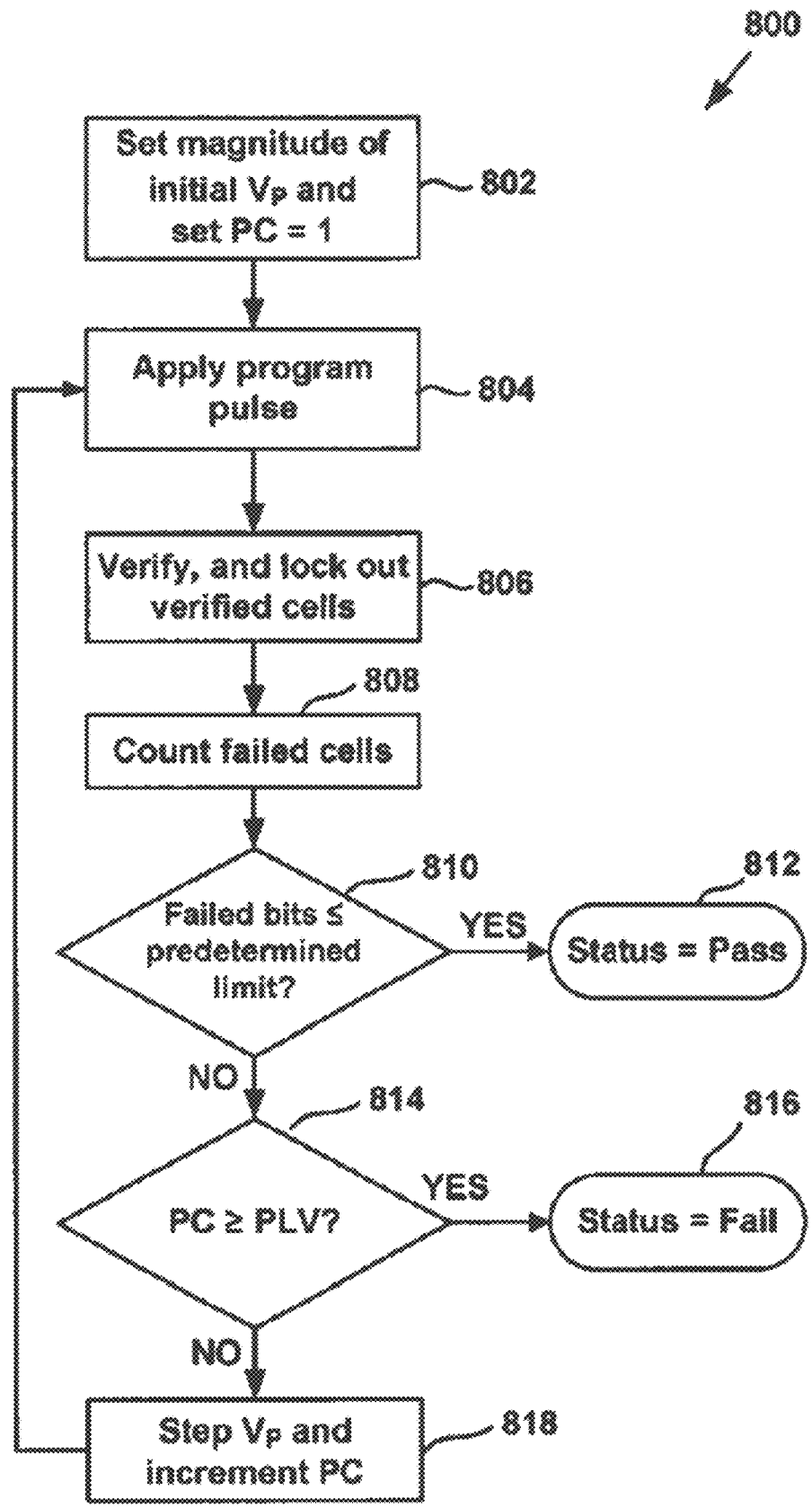
FIG. 8 is a flowchart describing an embodiment of a process for programming non-volatile memory according to aspects of the disclosure.

FIG. 8 is a flowchart describing an embodiment of a process 800 for programming a memory cell. In an example embodiment, process 800 is performed on memory die 106 (FIG. 1) using the control circuits discussed above. For example, process 800 can be performed at the direction of state machine 216 (FIG. 2). Process 800 also can be used to implement the full sequence programming discussed above. Additionally, process 800 can be used to implement each phase of a multi-phase programming process.

Typically, a program voltage is applied to the control gates (via a selected word line) during a program operation as a series of program pulses. Between programming pulses are a set of verify pulses to perform verification. In many implementations, the magnitude of the program pulses increase with each successive program pulse by a predetermined program step size. In step 802 of process 800, a programming voltage ($V_P$) is initialized to a starting program voltage $V_{Pinit}$ (e.g., between about 12V to about 16V, or some other value) and a program counter PC maintained by state machine 216 is initialized at 1.

In step 804, a program pulse having a magnitude $V_P$ is applied to the selected word line (the word line selected for programming). In an embodiment, the group of memory cells being concurrently programmed are all connected to the same word line (the selected word line). If a memory cell is to be programmed, then the corresponding bit line coupled to the memory cell is grounded. If a memory cell should remain at its current threshold voltage, then the corresponding bit line coupled to the memory cell is connected to Vdd to inhibit programming. In an embodiment, the unselected word lines receive one or more boosting voltages (e.g., between about 7V to about 11V, or some other value) to perform boosting schemes known in the art.

In step 804, the program pulse is applied to all memory cells connected to the selected word line so that all of the connected memory cells are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 806, the memory cells are verified using the appropriate set of verify reference voltages to perform one or more verify operations. In an embodiment, the verification process is performed by testing whether the threshold voltages of the memory cells selected for programming have reached the appropriate verify reference voltage.

In step 808, the memory system counts the number of memory cells that have not yet reached their respective target threshold voltage distribution. That is, the system counts the number of memory cells that have so far failed the verify process. This counting can be done by state machine 216 (FIG. 2), controller 104 (FIG. 1), or other logic. In the remaining discussion, the term "Controller Device" may be one or more of controller 104 of FIG. 1, control circuitry 204 of FIG. 2, state machine 216 of FIG. 2, or other similar controller device.

In an embodiment, each of sense blocks 212 (FIG. 2) stores the status (pass/fail) of their respective memory cells. In an embodiment, one total count reflects the total number of memory cells currently being programmed that have failed the last verify step. In another embodiment, separate counts are kept for each data state.

In step 810, a determination is made whether the count from step 808 is less than or equal to a predetermined limit. In an embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 812. In this situation, enough memory cells programmed correctly such that the few remaining memory cells that have not been completely programmed can be corrected using ECC during the read process.

In some embodiments, the predetermined limit used in step 810 is below the number of bits that can be corrected by error correction codes (ECC) during a read process to allow for future/additional errors. When programming less than all of the memory cells for a page, or comparing a count for only one data state (or less than all states), then the predetermined limit can be a portion (pro-rata or not pro-rata) of the number of bits that can be corrected by ECC during a read process for the page of memory cells. In some embodiments, the limit is not predetermined. Instead, the limit changes based on the number of errors already counted for the page, the number of program-erase cycles performed or other criteria.

If the number of failed memory cells is not less than the predetermined limit, then the programming process continues at step 814 and the program counter PC is checked against a program limit value (PLV). Examples of program limit values include 6, 12, 16, 20 and 30, although other values can be used. If the program counter PC is greater than or equal to program limit value PLV, then the program process is considered to have failed and a status of FAIL is reported in step 816.

If the program counter PC is not greater than or equal to program limit value PLV, then the process continues at step 820 in which the Program Counter PC is incremented by 1 and program voltage $V_P$ is stepped up to the next magnitude. For example, the next program pulse will have a magnitude greater than the previous pulse by a program step size $\Delta V_P$ (e.g., a step size of between about 0.1V to about 1.0V, or some other value). The process loops back to step 804 and another program pulse is applied to the selected word line so that another iteration (steps 804-818) of programming process 800 is performed. Each pass through steps 804-818 is referred to herein as a "program loop."

In general, during verify operations and read operations, the selected word line is connected to a voltage (one example of a reference signal), a level of which is specified for each read operation (e.g., read compare levels Vr1, Vr2, Vr3, Vr4, Vr5, Vr6, and Vr7, of FIG. 5) or verify operation (e.g. verify target levels Vv1, Vv2, Vv3, Vv4, Vv5, Vv6, and Vv7 of FIG. 5) to determine whether a threshold voltage of the selected memory cell has reached such level.

In an embodiment, after an appropriate read or verify voltage is applied to a selected word line, a conduction current of the memory cell is measured to determine whether the memory cell turned ON (conducts current) in response to the voltage applied to the word line. If the conduction current is measured to be greater than a certain value, then it is assumed that the memory cell turned ON and the voltage applied to the word line is greater than the threshold voltage of the memory cell.

If the conduction current is measured to be not greater than the certain value, then the memory cell did not turn ON, and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate at which the memory cell discharges or charges a dedicated capacitor in a sense amplifier. In another example, the conduction current of the selected memory cell allows (or fails to allow) the NAND string that includes the memory cell to discharge a corresponding bit line. The voltage on the bit line is measured after a period of time to see whether or not the bit line has been discharged. Note that the technology described herein can be used with different methods known in the art for verifying/reading. Other read and verify techniques known in the art also can be used.

As described above, at step 804 a program pulse is applied to the selected word line, and at step 806 memory cells coupled to the selected word line are verified using an appropriate set of verify reference voltages to perform one or more verify operations. Steps 804 and 806 are part of an iterative loop in which program pulses are applied as a series of program pulses that step up in magnitude, with intervening verify reference pulses between consecutive program pulses. Such an iterative loop is referred to herein as a "program-verify iteration."

Figure 9:
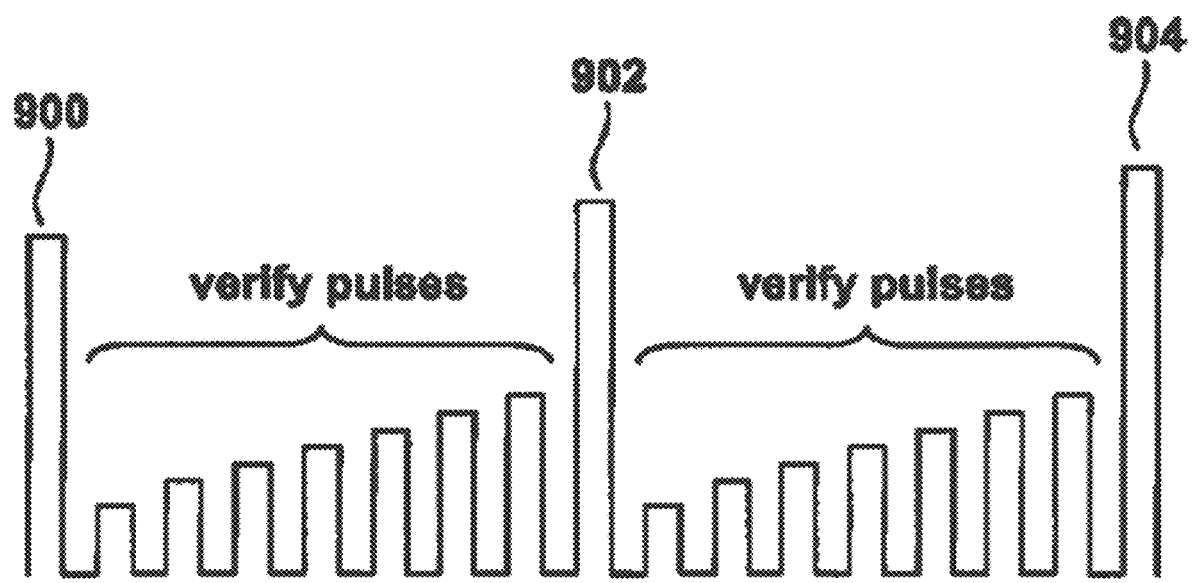
FIG. 9 depicts a word line voltage during programming and verify operations according to aspects of the disclosure.

FIG. 9 illustrates an example of such program-verify pulses applied to a selected word line. In particular, FIG. 9 depicts program pulses 900, 902 and 904 applied to the selected word line during three successive iterations of step 804 of FIG. 8. Between program pulses 900, 902 and 904 verify pulses are applied to the selected word line during three successive program-verify iterations of steps 804-806 of FIG. 8 to determine whether threshold voltages of the memory cells are greater than the respective verify reference voltages.

FIG. 9 shows a verify pulse for each of the programmed states S1-S7 between each of program pulses 900, 902 and 904. These verify pulses consume a significant portion of a program operation. As the number of programmed states stored per memory cell increases, this situation becomes worse, limiting programming speed. FIG. 9 corresponds to memory cells that store 3-bits per cell and require 7 verify levels. In a 4-bit per cell embodiment, a verify of all non-erased states would need 15 verify operations between program pulses.

To improve performance, some verify operations can be omitted during the programming operation through use of smart-verify algorithms to reduce programming time. For example, an embodiment a smart-verify operation for word line WLn performs a program-verify iteration on memory cells of String0 coupled to word line WLn.

In an embodiment, the program-verify iteration determines a minimum number of program loops (referred to herein as "smart-verify loop count") needed to program memory cells of String0 to a particular programmed state (e.g., the lowest programmed state S1 in FIG. 5 or 7E). The process of determining a smart-verify loop count is also referred to herein as "smart-verify acquisition," and the determined smart-verify loop count is also referred to herein as the acquired smart-verify loop count.

The acquired smart-verify loop count is then used to determine a smart-verify starting program voltage for programming memory cells of String1-String3 coupled to word line WLn. In particular, the smart-verify starting program voltage $V_{PSn}$ for memory cells of String1-String3 coupled to word line WLn is:

$$V_{PS} = V_{Pinit} + \text{SVloop}_n \times \Delta_{PS} \tag{1}$$

where $\text{SVloop}_n$ is the acquired smart-verify loop count for word line WLn, and $\Delta V_{PS}$ is a program step size for smart-verify (e.g., a step size of between about 0.1V to about 1.0V, or some other value). That is, the determined smart-verify starting program voltage $V_{PSn}$ for memory cells of String1-String3 coupled to word line WLn is initial program voltage $V_{Pinit}$ plus the acquired smart-verify loop count multiplied by program step size for smart-verify $\Delta V_{PS}$. In some embodiments, program step size for smart-verify $\Delta V_{PS}$ may have a same or a different value than program step size $\Delta V_P$. For example, in an embodiment program step size for smart-verify $\Delta V_{PS}$ is less than program step size $\Delta V_P$.

This same process is repeated for each subsequent word line (e.g., word lines WLn+1, WLn+2, . . . ), first performing a program-verify iteration on memory cells of String0 coupled to the word line to acquire a smart-verify loop count for those memory cells, and then using the acquired smart-verify loop count to determine a smart-verify starting program voltage $V_{PSn}$ for programming memory cells of String1-String3 coupled to the word line.

Because adjacent word lines are physically located close to one another on a memory die, memory cells on adjacent word lines often have similar programming characteristics. Accordingly, additional program time reduction may be achieved by performing a smart-verify operation for 1 of every k word lines, skipping smart-verify operations on the next k−1 consecutive word lines, and instead using the acquired smart-verify loop count for one word line to determine a smart-verify starting program voltage for programming memory cells coupled to the next k−1 consecutive word lines. Such techniques are referred to herein as "$WL_k$ skip smart-verify."

For example, if k=4, a smart-verify operation is performed for 1 of every 4 word lines. That is, smart verify operations are performed on word lines WL0, WL4, WL8, ..., and smart-verify operations are skipped on word lines WL1, WL2, WL3, WL5, WL6, WL7, WL9, WL10, WL11, and so on.

In particular, the acquired smart-verify loop count $SVloop_0$ for word line WL0 is used to determine a smart-verify starting program voltage $V_{PS0}$ for programming memory cells of String1-String3 coupled to word line WL0 and memory cells of String0-String3 coupled to word lines WL1, WL2 and WL3. Similarly, the acquired smart-verify loop count $SVloop_4$ for word line WL4 are used to determine a smart-verify starting program voltage $V_{PS4}$ for programming memory cells of String1-String3 coupled to word line WL4 and memory cells of String0-String3 coupled to word lines WL5, WL6 and WL7. Likewise, the acquired smart-verify loop count $SVloop_8$ for word line WL8 are used to determine a smart-verify starting program voltage $V_{PS8}$ for programming memory cells of String1-String3 coupled to word line WL8 and memory cells of String0-String3 coupled word lines WL9, WL10 and WL11, and so on.

Figure 10:
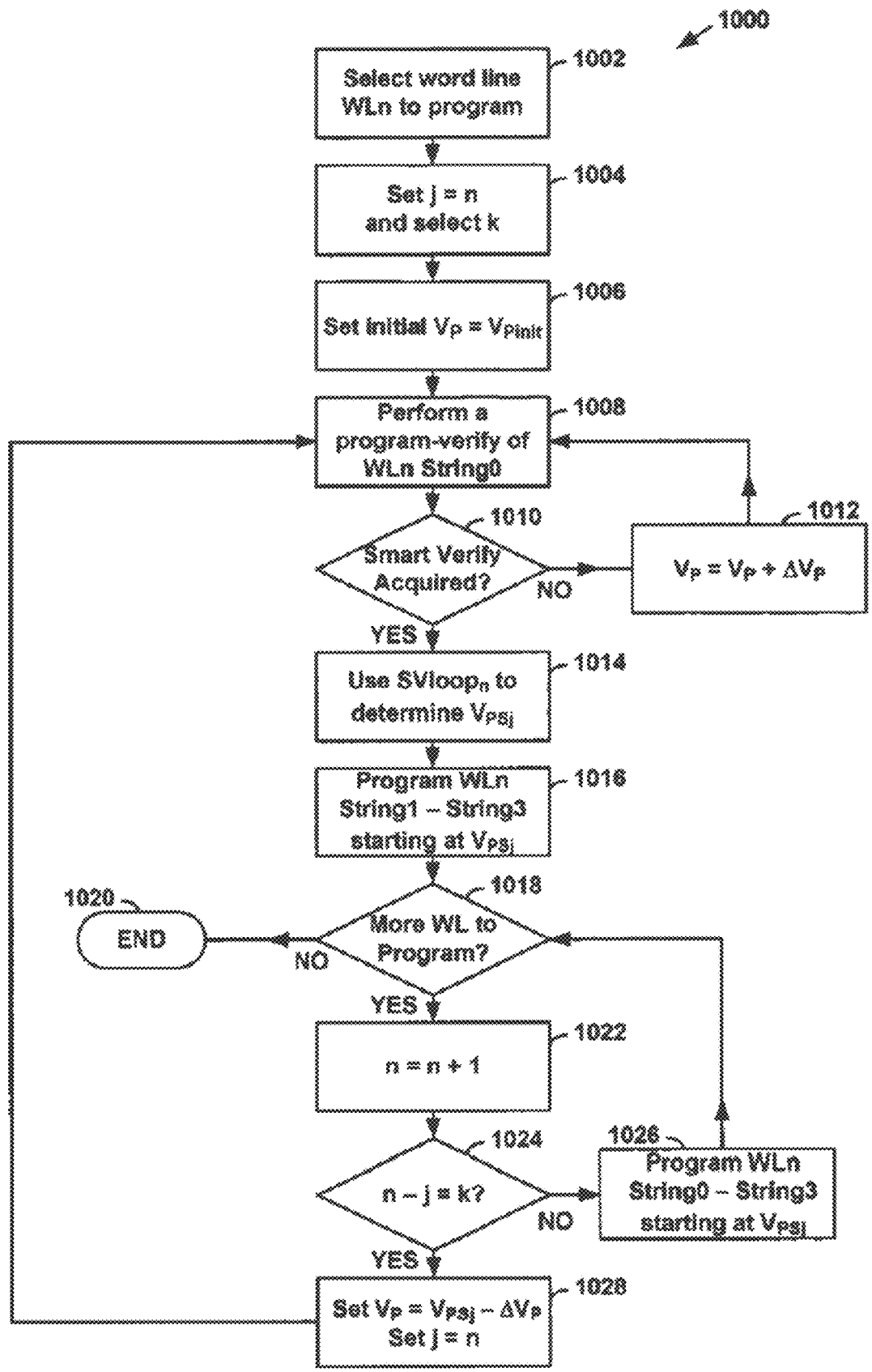
FIG. 10 is a flowchart describing an embodiment of another process for programming non-volatile memory according to aspects of the disclosure.

FIG. 10 is a flowchart describing an embodiment of a process 1000 for programming memory cells using a $WL_k$ skip smart-verify algorithm. In an example embodiment, process 1000 is performed on memory die 106 (FIG. 1) using the Controller Device described above. For example, process 1000 can be performed at the direction of state machine 216 (FIG. 2).

Beginning at step 1002, a word line WLn is selected for programming, where n is an integer word line counter (e.g., n=0, 1, 2, ...). For example, if word line counter n=0, word line WL0 is selected for programming.

At step 1004, a skip counter j is set equal to word line counter n, and a value k is selected, where k is an integer number of word lines that are skipped from performing smart-verify operations (e.g., k=2, 3, 4, ...). In the example above, if word line counter n=0, skip counter j=0. If k=4, smart-verify operations will be performed once for every four word lines (e.g., word lines WL0, WL4, WL8, ...). At step 1006, program voltage $V_P$ is set to an initial value $V_{Pinit}$ (e.g., between about 12V to about 16V, or some other value).

At step 1008, a program-verify iteration is performed on memory cells of String0 coupled to word line WLn. The program-verify operation includes applying program voltage $V_P$ to the memory cells of String0 coupled to word line WLn and applying a verification signal (e.g., a voltage waveform) to those memory cells while performing verify steps for one or more data states. For example, verify steps may be performed for the lowest programmed state (e.g., programmed state S1 in FIG. 5 or 7E).

At step 1010, based on the results of the verify tests of step 1008 a determination is made whether a smart-verify loop count has been acquired. In an embodiment, smart-verify acquisition is complete if all or nearly all of the memory cells of String0 coupled to word line WLn have reached a target threshold voltage (e.g., the verify voltage of the lowest programmed state). Other target threshold voltages also may be used.

If at step 1010 a determination is made that not all or nearly all of the memory cells of String0 coupled to word line WLn have reached a target threshold voltage, then at step 1012 program voltage $V_P$ is stepped up to the next magnitude by program step size $\Delta V_P$. For example, program step size $\Delta V_P$. may be between about 0.1V to about 1.0V, or some other value. Next, the programming operation returns to step 1008 to perform the next program-verify iteration. This loop of steps 1008-1012 continues until a determination is made at step 1010 that smart-verify acquisition is complete.

If at step 1010 a determination is made that smart-verify acquisition is complete (e.g., all or nearly all of the memory cells of String0 coupled to word line WLn have reached a target threshold voltage), then at step 1014 the acquired smart-verify loop count $SVloop_n$ for word line WLn is used to determine a smart-verify starting program voltage $V_{PS}$, for word line WLn.

At step 1016, the memory cells of String1-String3 coupled to word line WLn are programmed beginning with the determined smart-verify starting program voltage $V_{PSj}$. So for example, if word line counter n=0, skip counter j=0, the memory cells of String1-String3 coupled to word line WL0 are programmed beginning with the determined smart-verify starting voltage $V_{PS0}$.

At step 1018, a determination is made whether any additional word lines are to be programmed. If a determination is made at step 1018 that no additional word lines are to be programmed, then at step 1020 process 1000 completes. If, however, a determination is made at step 1018 that additional word lines are to be programmed, then at step 1022 word line counter n is incremented by 1. So continuing with the previous example, word line counter n=1.

At step 1024, a determination is made whether a difference between word line counter n and skip counter j equals skip value k. If a determination is made that a difference between word line counter n and skip counter j does not equal skip value k, at step 1026 the memory cells of String0-String3 coupled to word line WLn are programmed beginning with the determined smart-verify starting voltage $V_{PSj}$. So for example, if word line counter n=1, skip counter j=0, and skip value k=4, the memory cells of String0-String3 coupled to word line WL1 are programmed beginning with the determined smart-verify starting voltage $V_{PS0}$.

Process 1000 then loops back to step 1018 to determine whether any additional word lines are to be programmed. If there are additional word lines to be programmed, steps 1018-1026 repeat until the difference (n-j) equals skip value k. Thus, continuing the previous example, the memory cells of String0-String3 coupled to word lines WL2 and WL3 are programmed beginning with the determined smart-verify starting voltage $V_{PS0}$. Because smart-verify acquisition is avoided for word lines WL1, WL2 and WL3, the time required to program the memory cells coupled to word lines WL1, WL2 and WL3 is reduced.

If at step 1024 a determination is made that the difference between word line counter n and skip counter j equals skip value k, then at step 1028 program voltage $V_P$ is set to the determined starting program voltage $V_{PSj}$ minus program step size $\Delta V_P$, and skip counter j is set equal to word line counter n. Process 1000 then loops back to step 1008 to perform a program-verify on memory cells of String0 coupled to word line WLn.

For example, if word line counter n=4, program voltage $V_P$ is set to the determined starting voltage $V_{PS0}$ minus program step size $\Delta V_P$, skip counter j=4, and at step 1008 a program-verify is performed on memory cells of String0 coupled to word line WL4. In this regard, the programming of memory cells of String0 coupled to word line WL4 may begin using a program voltage $V_P$ just below the determined smart-verify starting program voltage $V_{PS0}$. Alternatively, at step 1028 program voltage $V_P$ may be reset to initial value $V_{Pinit}$.

The loop including steps 1008-1012 repeats until at step 1010 a determination is made that smart-verify acquisition is complete (e.g., all or nearly all of the memory cells of String0 coupled to word line WL4 have reached a target threshold voltage), and at step 1014 the acquired smart-verify loop count $SVloop_4$ for word line WL4 is used to determine a smart-verify starting program voltage $V_{PS4}$ for word line WL4.

Process 1000 continues in this manner until at step 1016 there are no more word lines to program, performing smart-verify operations for 1 of every k word lines, and skipping smart-verify operations on the next k−1 consecutive word lines. Table 1, below, depicts the programming operations of ten consecutive word lines beginning with word line WL0, with k=4:

TABLE 1

| Word Line | Smart-Verify | String0 | String1 | String2 | String3 |
|---|---|---|---|---|---|
| WL0 | Yes | Acquire $SVloop_0$ Determine $V_{PS0}$ | Use $V_{PS0}$ | Use $V_{PS0}$ | Use $V_{PS0}$ |
| WL1 | Skip | Use $V_{PS0}$ | Use $V_{PS0}$ | Use $V_{PS0}$ | Use $V_{PS0}$ |
| WL2 | Skip | Use $V_{PS0}$ | Use $V_{PS0}$ | Use $V_{PS0}$ | Use $V_{PS0}$ |
| WL3 | Skip | Use $V_{PS0}$ | Use $V_{PS0}$ | Use $V_{PS0}$ | Use $V_{PS0}$ |
| WL4 | Yes | Acquire $SVloop_4$ Determine $V_{PS4}$ | Use $V_{PS4}$ | Use $V_{PS4}$ | Use $V_{PS4}$ |
| WL5 | Skip | Use $V_{PS4}$ | Use $V_{PS4}$ | Use $V_{PS4}$ | Use $V_{PS4}$ |
| WL6 | Skip | Use $V_{PS4}$ | Use $V_{PS4}$ | Use $V_{PS4}$ | Use $V_{PS4}$ |
| WL7 | Skip | Use $V_{PS4}$ | Use $V_{PS4}$ | Use $V_{PS4}$ | Use $V_{PS4}$ |
| WL8 | Yes | Acquire $SVloop_8$ Determine $V_{PS8}$ | Use $V_{PS8}$ | Use $V_{PS8}$ | Use $V_{PS8}$ |
| WL9 | Skip | Use $V_{PS8}$ | Use $V_{PS8}$ | Use $V_{PS8}$ | Use $V_{PS8}$ |

In some embodiments, particular word lines may be "special" word lines that are always subject to program-verify operations and are not included in the $WL_k$ skip smart-verify algorithm. For example, in some implementations word line WL0 is a special word line, and is not included in the skip smart-verify process. Instead, in such implementations the skip smart-verify process begins with word line WL1. Table 2, below, depicts the programming operations of ten consecutive word lines beginning with word line WL0, with k=4, with WL0 being a special word line:

TABLE 2

| Word Line | Smart-Verify | String0 | String1 | String2 | String3 |
|---|---|---|---|---|---|
| WL0 | Yes | Acquire $SVloop_0$ Determine $V_{PS0}$ | Use $V_{PS0}$ | Use $V_{PS0}$ | Use $V_{PS0}$ |

TABLE 2-continued

| Word Line | Smart-Verify | String0 | String1 | String2 | String3 |
|---|---|---|---|---|---|
| WL1 | Yes | Acquire $SVloop_1$ Determine $V_{PS1}$ | Use $V_{PS1}$ | Use $V_{PS1}$ | Use $V_{PS1}$ |
| WL2 | Skip | Use $V_{PS1}$ | Use $V_{PS1}$ | Use $V_{PS1}$ | Use $V_{PS1}$ |
| WL3 | Skip | Use $V_{PS1}$ | Use $V_{PS1}$ | Use $V_{PS1}$ | Use $V_{PS1}$ |
| WL4 | Yes | Acquire $SVloop_4$ Determine $V_{PS4}$ | Use $V_{PS4}$ | Use $V_{PS4}$ | Use $V_{PS4}$ |
| WL5 | Skip | Use $V_{PS4}$ | Use $V_{PS4}$ | Use $V_{PS4}$ | Use $V_{PS4}$ |
| WL6 | Skip | Use $V_{PS4}$ | Use $V_{PS4}$ | Use $V_{PS4}$ | Use $V_{PS4}$ |
| WL7 | Skip | Use $V_{PS4}$ | Use $V_{PS4}$ | Use $V_{PS4}$ | Use $V_{PS4}$ |
| WL8 | Yes | Acquire $SVloop_8$ Determine $V_{PS8}$ | Use $V_{PS8}$ | Use $V_{PS8}$ | Use $V_{PS8}$ |
| WL9 | Skip | Use $V_{PS8}$ | Use $V_{PS8}$ | Use $V_{PS8}$ | Use $V_{PS8}$ |

As described above, significant advances in memory technology have resulted from steadily reducing the physical dimensions of memory cells, which in turn can be packed more densely on a given die area. Doing so, however, may result in a greater number of manufacturing defects, such as shorting between word lines and other components (such as shorting between adjacent word lines, shorting between word lines and interconnects, shorting between word lines and the substrate) as well as broken word lines.

In many instances, such manufacturing defects do not affect performance of the memory system until the memory system has been used for one or more program-erase cycles, and may only begin to corrupt data after an end user begins programming and erasing memory cells in such memory devices. One technique for addressing such latent manufacturing defects is referred to herein as early program termination (EPT).

In particular, a Controller Device implementing EPT terminates a programming process early when a defect condition exists. Rather than wait until a programming process ends to determine whether a defect condition exists, the Controller Device tests for the defect condition during the programming process. If a defect condition is identified (referred to herein as an "EPT status failure," the Controller Device stops the programming process prior to completing programming. A Controller Device may implement an embodiment of EPT during "multi-plane programming," in which a memory structure is divided into multiple planes, and memory cells in the multiple planes connected to the same word lines may be programmed concurrently.

Figure 11:
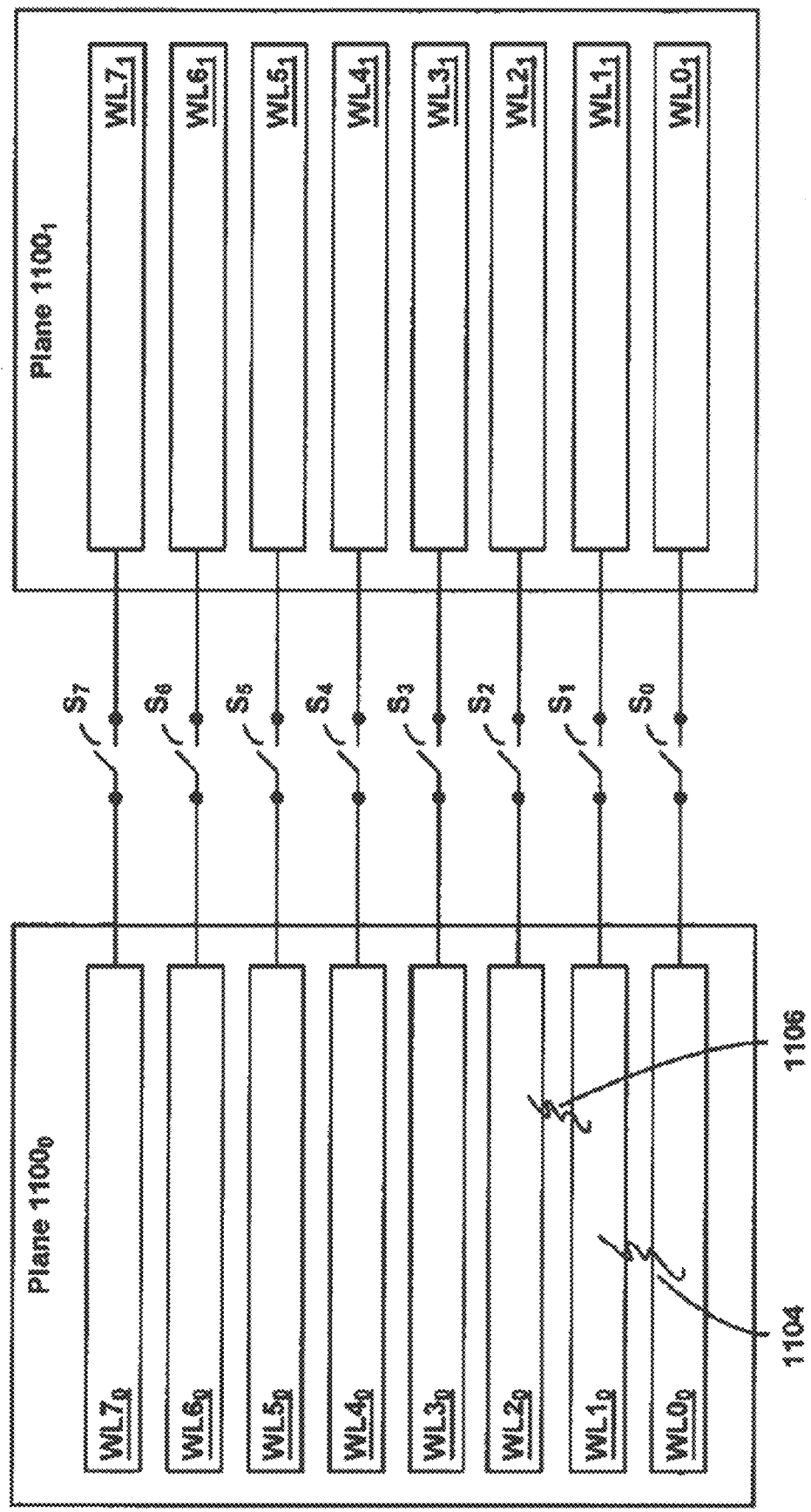
FIG. 11 is a block diagram of a memory structure having two planes according to aspects of the disclosure.

FIG. 11 is a block diagram depicting a simplified multi-plane organization of memory structure 202 (FIG. 2), which is divided into a first plane 1100₀ and a second plane 1100₁ located on the same memory die 200 (FIG. 2). First plane 1100₀ includes eight word lines $WL0_0, WL1_0, WL2_0, \ldots, WL7_0$, and second plane 1100₁ includes eight word lines $WL0_1, WL1_1, WL2_1, \ldots, WL7_1$. In other embodiments, first plane 1100₀ and second plane 1100₁ each may include more or fewer than eight word lines.

Switches $S_0, S_1, \ldots, S_7$ may be used to selectively couple word lines $WL0_0, WL1_0, \ldots, WL7_0$ on first plane 1100₀ to corresponding word line $WL0_1, WL2_1, \ldots, WL7_1$ on second plane 1100₁. In multi-plane programming switch $S_0$ closes to couple word lines $WL0_0$ and $WL0_1$, switch $S_1$ closes to couple word lines $WL1_0$ and $WL1_1$, switch $S_2$ closes to selectively couple word lines $WL2_0$ and $WL2_1$, and so on.

In the illustrated example, as a result of a manufacturing defect, a first word line-to-word line short 1104 exists between word line WL0$_0$ and word line WL1$_0$, and a second word line-to-word line short 1106 exists between word line WL1$_0$ and word line WL2$_0$. In this example, the manufacturing defects are only on word lines in first plane 1100$_0$. No word line-to-word line shorts exist on second plane 1100$_1$. In other instances, manufacturing defects may exist only in second plane 1100$_1$, or in both first plane 1100$_0$ and second plane 1100$_1$.

During programming, one or more programming pulses are applied to word lines WL0$_0$ and WL0$_1$, one or more programming pulses are applied to word lines WL1$_0$ and WL1$_1$, one or more programming pulses are applied to word lines WL2$_0$ and WL2$_1$, and so on. As a result of first word line-to word line short 1104 and second word line-to word line short 1106, programming of memory cells coupled to word line WL0$_0$ fails because the voltage of word line WL0$_0$ is pulled down by shorted word lines WL1$_0$ and WL2$_0$.

In particular, word line WL0$_0$ is unable to reach a high enough voltage level to successfully program memory cells coupled to word line WL0$_0$ before the maximum number of program loops is reached (e.g., step 816=YES in FIG. 8). First word line-to word line short 1104 and second word line-to word line short 1106 cause the same failure to occur while attempting to program memory cells coupled to word lines WL1$_0$ and WL2$_0$.

Although no word line-to-word line shorts exist in second plane 1100$_1$, switches S$_0$, S$_1$, . . . , S$_7$, couple corresponding word lines on first plane 1100$_0$ and second plane 1100$_1$. Accordingly, because the voltage of WL0$_0$ is pulled down by shorted word lines WL1$_0$ and WL2$_0$, coupled word line WL0$_1$ also is unable to reach a high enough voltage level to successfully program memory cells coupled to word line WL0$_1$ before the maximum number of program loops is reached (e.g., step 816=YES in FIG. 8). Likewise, the same failure occurs while attempting to program memory cells coupled to word lines WL1$_1$ and WL2$_1$.

This phenomenon is sometimes referred to as "neighbor plane disturb," or "NPD." In such a scenario, first plane 1100$_0$ is sometimes referred to as the "attacker block," and second plane 1100$_1$ is sometimes referred to as the "victim block" because word line defects on first plane 1100$_0$ disturb programming of coupled word lines of second plane 1100$_1$. EPT techniques, such as those described above, may be used to mitigate the impact of NPD. Accordingly, EPT techniques are sometimes referred to as "NPD countermeasures."

As mentioned above, tradeoffs may exist with tuning the number of program loops allowed before early program termination. In more detail, NPD causes higher defective part per million (DPPM), because it generally leads to victim block UECC (uncorrectable by error correction code) failure, and results in data loss, which is difficult to overcome. While early program termination (EPT) assists with such difficulties by terminating slow plane during multiple planes program operation, the number of EPT loops, which may be finetuned, still results in a tradeoff between catch rate and overkill, and causes some NPD DPPM escape from time to time. The number of EPT loops allowed controls a state program loop delta between different planes. If EPT loop specification (allowed number of program loops before early termination) is set tight, for example, a shorted or slow plane will be terminated earlier, resulting in less disturb on good planes. But if the EPT loop specification is set too tight, it will overkill good planes with program speed variation. In one example, EPT with 3 loops can provide a good catch rate without any overkill, while EPT with 2 loops provides an excellent catch rate, but causes significant overkill DPPM during user cycling.

In addition, when program operation related trim or parameters are changed during development, a previously finetuned number of EPT loops may become inappropriate for the new trim. Thus, finetuning of the EPT loop may need to be performed again, which will delay technology development. Moreover, there is program speed variation from word line to word line. For example bottom word lines (i.e., located at a bottom of the stack of word lines) (assuming program starts from top word line) of victim planes are more vulnerable to program disturb type of NPD when there is a shorted plane. Therefore, a fixed EPT loop typically is not good for device mode effectiveness and an improved smart EPT loop algorithm that addresses these shortcomings would be advantageous.

Previous approaches to address NPD issue focuses on two aspects, first, reducing defects density from process, but this is not easy because of process complexity as memory apparatuses keep shrinking for higher density. Word line to word line, word line to memory hole, or word line to local interconnect shorts, which usually cause the NPD issue, are still significant failure modes in modern memory apparatuses. Secondly, new device modes like EPT are utilized, but there is still DPPM escape and other shortcomings for current EPT mode as discussed above.

Consequently, described herein is a memory apparatus (e.g., storage system 100 of FIG. 1, memory die 200 of FIG. 2) including memory cells (e.g., memory cells MC1-MC5 of FIG. 4E) each connected to one of a plurality of word lines (e.g., word line layers WLL0-WLL127 of FIG. 4C). The memory cells are disposed in memory holes (e.g., memory holes 410 and 454 of FIG. 4C) and configured to retain a threshold voltage corresponding to one of a plurality of data states (e.g., data states S0-S7 of FIG. 5). The memory holes are arranged in rows (e.g., horizontal rows of memory holes 408, 410, 412, 414, 454 of FIG. 4B) comprising a plurality of strings (e.g., strings String0, String1, String2, String3 of FIG. 4B). The plurality of strings are grouped into a plurality of blocks (e.g., Block 0-Block M−1 of FIG. 4A) comprising a first plane and a second plane (e.g., planes 400 *a* and 400 *b* of FIG. 4A). The memory apparatus also includes a control circuit or means (e.g., one or any combination of control circuitry 204, decoders 208, 210, sense blocks SB1, SB2, . . . , SBp, read/write circuits 206 of FIG. 2, and so forth) coupled to the plurality of word lines and the memory holes. The control means is configured to program memory cells of the first plane and the second plane connected to one of the plurality of word lines using a plurality of iterations of a program operation. The control means is also configured to terminate programming of the first plane prior to completing programming of the first plane in response to determining the first plane programs slower than the second plane by a predetermined number of the plurality of iterations of the program operation. In addition, the control means adjusts the predetermined number of the plurality of iterations based on an additional verify iteration performed on at least some of the memory cells beyond the plurality of iterations of the program operation. Although only a first plane and a second plane are discussed, it should be appreciated that numerous planes are contemplated. For example, the first plane can be considered to be one or more planes which are relatively slower to program, while the second plane may be one or more other planes which are relatively faster to program.

Figure 12:
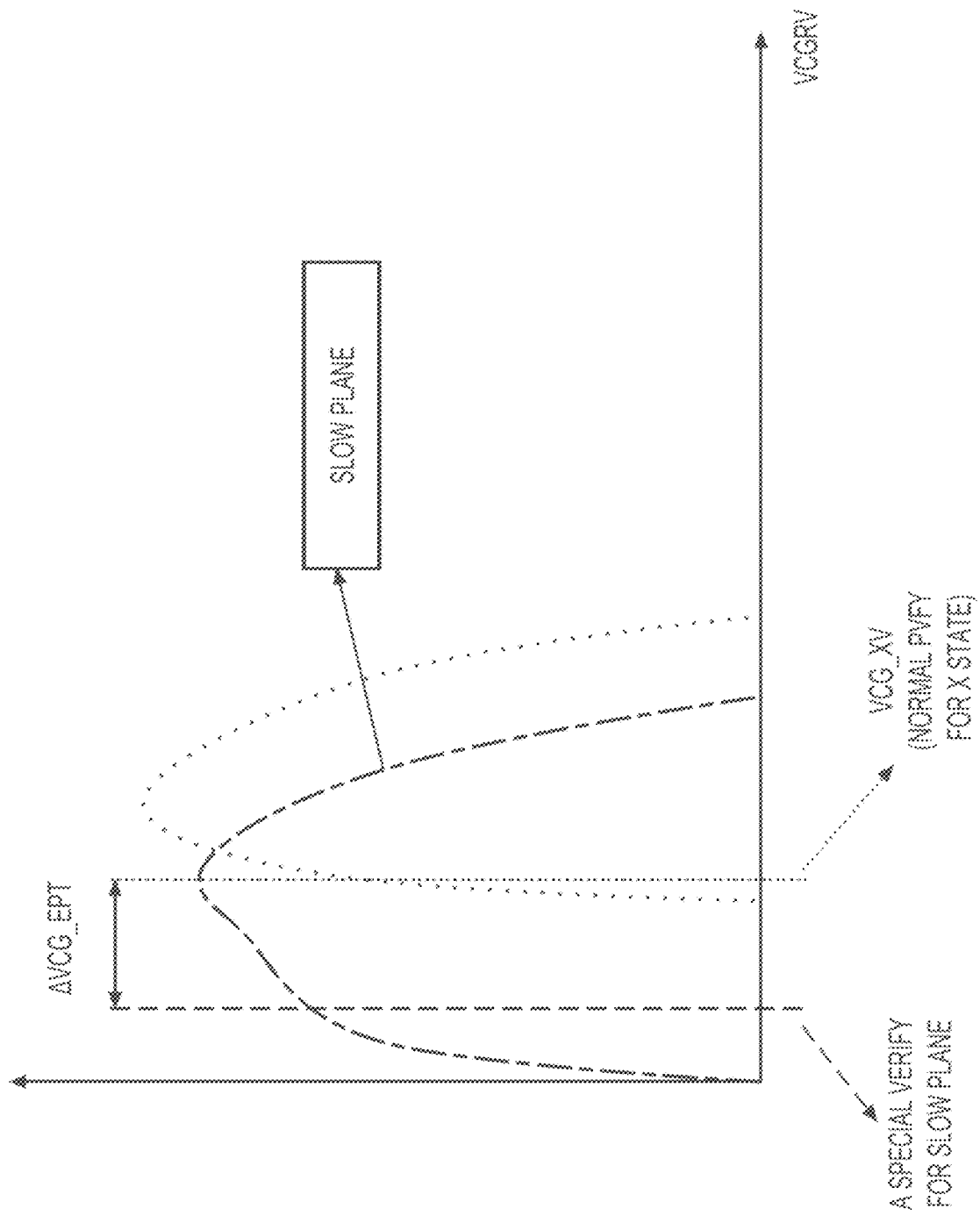
FIG. 12 shows a plot of threshold voltages of memory cells in two planes, with one plane programming slower and illustrates the additional verify iteration and corresponding additional verify voltage according to aspects of the disclosure.

FIG. 12 shows a plot of threshold voltages of memory cells in two planes, with one plane programming slower and illustrates the additional verify iteration and corresponding additional verify voltage. So, according to an aspect and still referring to FIG. 12, the control means is further configured to perform the additional verify iteration using an additional verify voltage less than one of a plurality of verify voltages VCG_XV associated with a targeted one of the plurality of data states being programmed by a predetermined delta amount $\Delta$VCG_EPT. More specifically, and according to another aspect, the predetermined delta amount $\Delta$VCG_EPT is in a range of approximately 0.3 volts to 0.5 volts. The additional verify iteration may only be performed on the word lines of the slowest plane. Thus, according to an aspect, the control means is further configured to perform the additional verify iteration on the memory cells connected to the one of the plurality of word lines of the first plane.

As discussed previously, the memory cells connected to each of the plurality of word lines in one of the plurality of strings may comprise one of a plurality of pages of memory cells. Thus, according to aspects of the disclosure, the control means is further configured to begin programming one of the plurality of pages of memory cells. The control means sets a current predetermined number of the plurality of iterations as an initial predetermined number of the plurality of iterations. According to an aspect, the initial predetermined number of the plurality of iterations is equal to two. The control means is also configured to program the memory cells of the one of the plurality of pages in the first plane and the second plane to the targeted one of the plurality of data states being programmed using one of a plurality of program pulses of one of the plurality of iterations. The control means determines whether the memory cells of the one of the plurality of pages in the first plane and the second plane are verified for the targeted one of the plurality of data states being programmed. The control means is additionally configured to determine whether the targeted one of the plurality of data states being programmed is the last one of the plurality of data states being programmed in response to determining the memory cells of the one of the plurality of pages in the first plane and the second plane are verified for the targeted one of the plurality of data states being programmed. In addition, the control means is configured to change the targeted one of the plurality of data states to a next one of the plurality of data states and return to program the memory cells of the one of the plurality of pages in the first plane and the second plane to the targeted one of the plurality of data states being programmed using the one of the plurality of iterations in response to determining the targeted one of the plurality of data states being programmed is not the last one of the plurality of data states being programmed. The control means ends programming of the one of the plurality of pages of memory cells and change the one of the plurality of pages to a next one of the plurality of pages and return to begin programming one of the plurality of pages of memory cells in response to determining the targeted one of the plurality of data states being programmed is the last one of the plurality of data states being programmed.

According to additional aspect of the disclosure, the control means is further configured to determine whether the memory cells of the one of the plurality of pages in the second plane are verified for the targeted one of the plurality of data states being programmed in response to determining the memory cells of the one of the plurality of pages in the first plane and the second plane are not verified for the targeted one of the plurality of data states being programmed. The control means is additionally configured to change the one of the plurality of iterations to a next one of the plurality of iterations and return to program the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the second plane are not verified for the targeted one of the plurality of data states being programmed. The control means determines whether the first plane programs slower than the second plane by the current predetermined number of the plurality of iterations of the program operation in response to determining the memory cells of the one of the plurality of pages in the second plane are verified for the targeted one of the plurality of data states being programmed. In addition, the control means is configured to perform the additional verify iteration on the memory cells of the one of the plurality of pages in the first plane using the additional verify voltage in response to determining the first plane programs slower than the second plane by the current predetermined number of the plurality of iterations of the program operation. The control means is also configured to change the one of the plurality of iterations to the next one of the plurality of iterations and return to program the memory cells of the one of the plurality of pages in the first plane and the second plane to the targeted one of the plurality of data states being programmed using the one of the plurality of program pulses of one of the plurality of iterations in response to determining the first plane does not program slower than the second plane by the current predetermined number of the plurality of iterations of the program operation. The control means determine whether the memory cells of the one of the plurality of pages in the first plane are verified using the additional verify voltage in the additional verify iteration. The control means is further configured to increment the current predetermined number of the plurality of iterations by one for the one of the plurality of pages and return to program the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the first plane are verified using the additional verify voltage in the additional verify iteration. The control means terminates programming of the first plane prior to completing programming of the first plane and return to program the memory cells of the one of the plurality of pages in the second plane to the targeted one of the plurality of data states being programmed using the one of the plurality of program pulses of one of the plurality of iterations in response to determining the memory cells of the one of the plurality of pages in the first plane are not verified by using the additional verify voltage in the additional verify iteration. According to an aspect, the initial predetermined number of the plurality of iterations is equal to two.

So, to avoid DPPM escape, the number of EPT loops or predetermined number of iterations can start from a relatively small value. For example, one loop may be too tight, but two loops for the initial predetermined number of the plurality of iterations is a reasonable setting. If EPT status fail during the programming or program operation for one state (i.e., state X), the first or slow plane programming will not be terminated immediately and the additional verify iteration or special verify with a relatively smaller verify voltage (e.g., VCG_XV-$\Delta$VCG_EPT) on slow plane can be performed. If the additional verify iteration passes, the EPT loop or predetermined number of iterations can be increased by one loop, and resume multiple planes program. However, if this additional verify iteration fails, programming of the slow plane terminates immediately. The additional verify iteration is to determine how far the slow plane (i.e., first plane) threshold voltage Vt is compared to the fast plane (i.e., second plane). A slightly slower plane (usually comes from program speed variation) will be resume programming, while a strongly slow plane (usually comes from defects) will be terminated early. FIGS. 13A and 13B show two sequences of iterations of a program operation of a fast plane and a slow plane for a memory apparatus without the additional verify iteration (FIG. 13A) and using the additional verify iteration (FIG. 13B). The smart EPT mode (i.e., the use of the additional verify iteration) described herein should not significantly impact program time tPROG for normal usage, since it only triggers for rare cases (as long as the predetermined number of the plurality of iterations that is initially used is reasonable). Thus, the smart EPT mode can avoid overkilling good blocks and capture bad blocks as early as possible. Therefore, it can work as an ultimate solution for NPD issue.

Figure 14B:
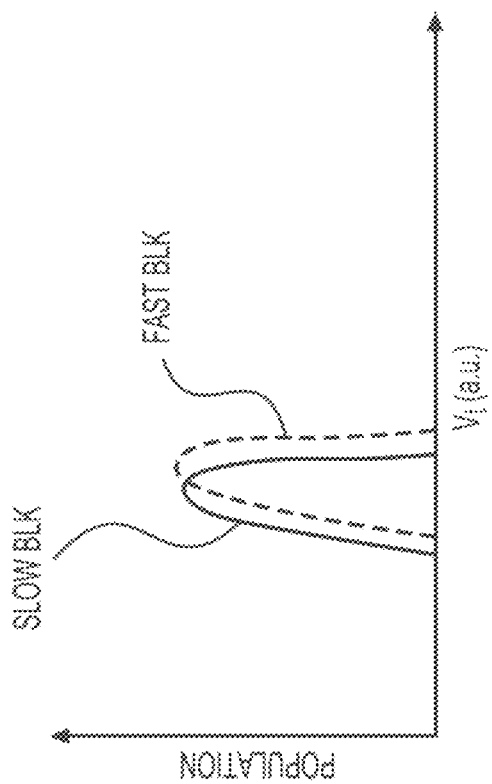
FIGS. 14A and 14B are plots of threshold voltage of the memory cells of two planes for both a true failure case and an overkill case according to aspects of the disclosure.
Figure 14A:
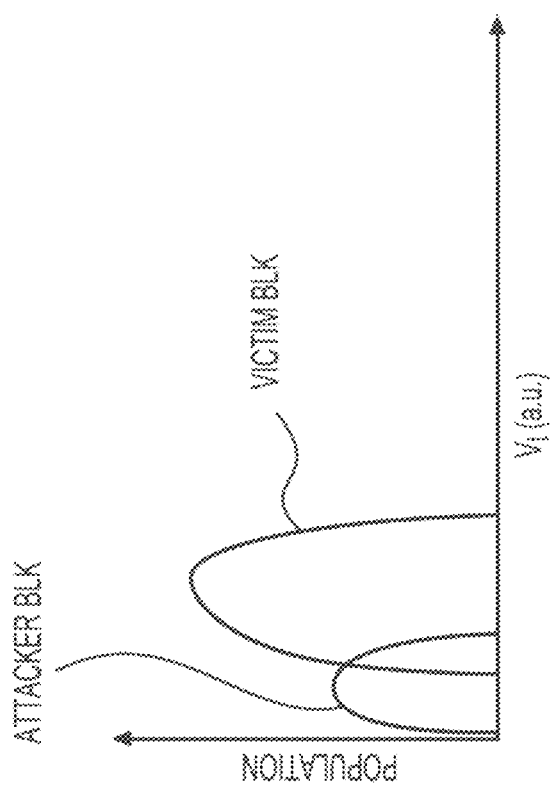

As further evidence, the parameters defining the predetermined number of the plurality of iterations, F_NLP_EPT_A and F_NLP_EPT, were set to two loops in an example memory apparatus. FIGS. 14A and 14B are plots of threshold voltage of the memory cells of two planes for both a true failure case (i.e., actual defect) (FIG. 14A) and an overkill case (FIG. 14B). For the true fail case (FIG. 14A), the attacker block threshold voltage Vt is far from the threshold voltage Vt of the victim block due to a strong short and should fail with the loosened or additional verify level (e.g., VCG_XV-ΔVCG_EPT). For the overkill case (FIG. 14B), the slow block threshold voltage Vt has some slow bits that causes it to fail a default verify level, but this slow block is easy to pass the loosened or additional verify level (VCG_XV-ΔVCG_EPT), thus, the EPT loop or number of the plurality of iterations will be increased by one loop or iteration to avoid overkilling this slow block. The slow block has been cycled to end of life, but still passes, so this is true overkill. With a proper setting of the predetermined delta amount ΔVCG_EPT, the smart EPT loop mode or technique described herein can catch all true defect failures without any overkills.

Figure 15:
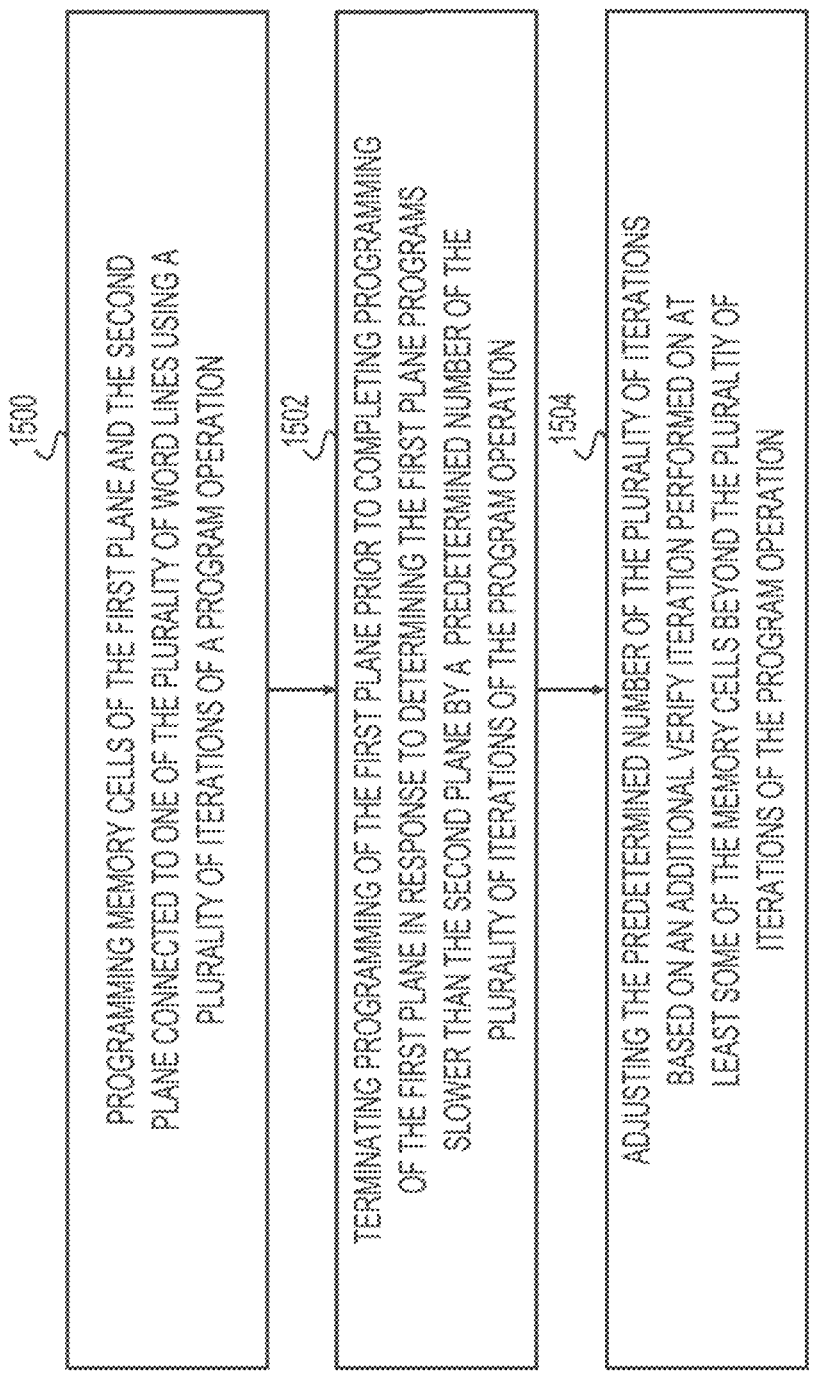
FIGS. 15-16 illustrate steps of a method of operating a memory apparatus according to aspects of the disclosure.
Figure 16:
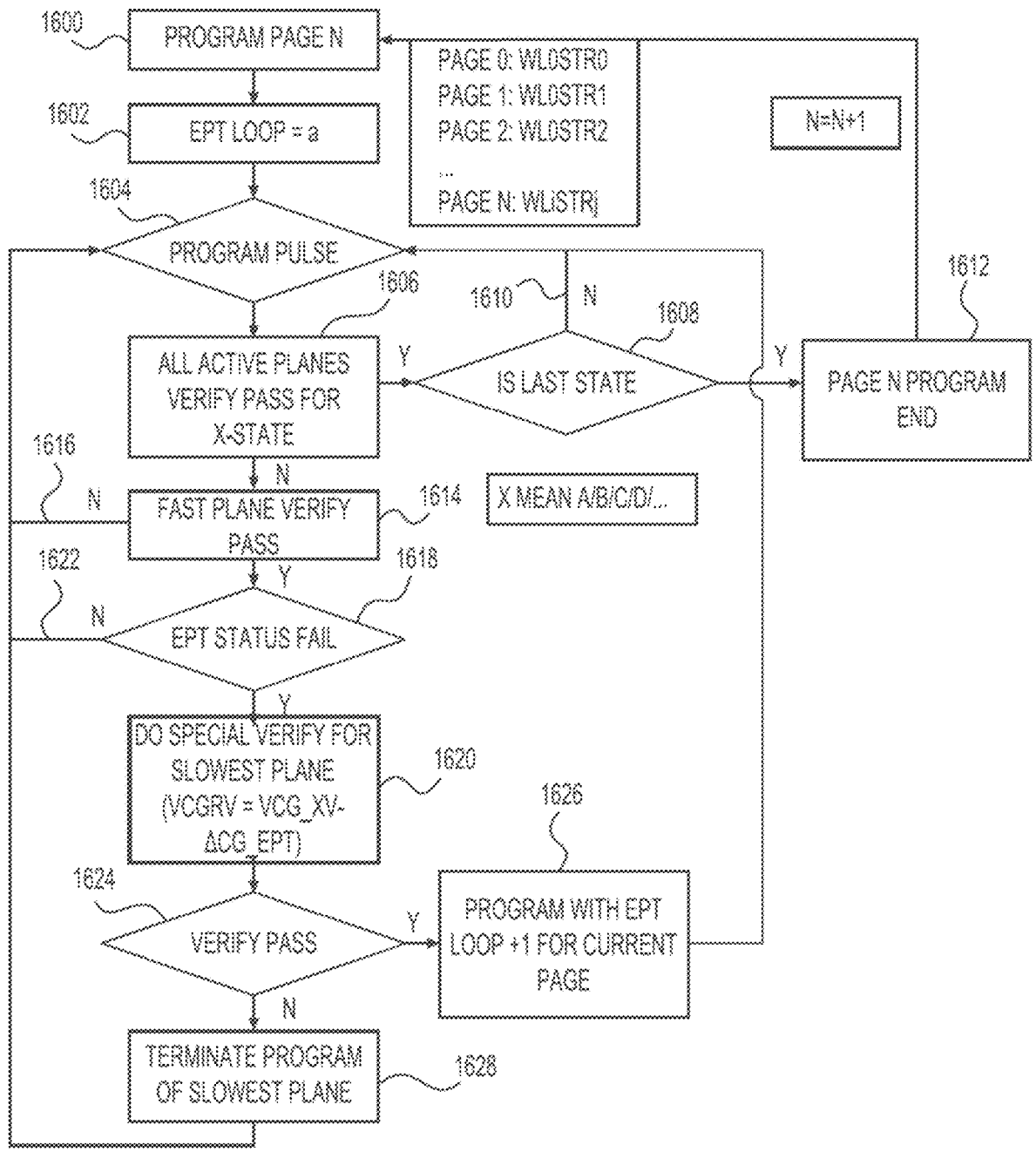

FIGS. 15-16 illustrate steps of a method of operating a memory apparatus. As discussed above, the memory apparatus (e.g., storage system 100 of FIG. 1, memory die 200 of FIG. 2) includes memory cells (e.g., memory cells MC1-MC5 of FIG. 4E) each connected to one of a plurality of word lines (e.g., word line layers WLL0-WLL127 of FIG. 4C). The memory cells are disposed in memory holes (e.g., memory holes 410 and 454 of FIG. 4C) and configured to retain a threshold voltage corresponding to one of a plurality of data states (e.g., data states S0-S7 of FIG. 5). The memory holes are arranged in rows (e.g., horizontal rows of memory holes 408, 410, 412, 414, 454 of FIG. 4B) comprising a plurality of strings (e.g., strings String0, String1, String2, String3 of FIG. 4B). The plurality of strings are grouped into a plurality of blocks (e.g., Block 0-Block M−1 of FIG. 4A) comprising a first plane and a second plane (e.g., planes 400a and 400b of FIG. 4A). The method includes the step of 1500 programming memory cells of the first plane and the second plane connected to one of the plurality of word lines using a plurality of iterations of a program operation. The method continues by 1502 terminating programming of the first plane prior to completing programming of the first plane in response to determining the first plane programs slower than the second plane by a predetermined number of the plurality of iterations of the program operation. The method also includes the step of 1504 adjusting the predetermined number of the plurality of iterations based on an additional verify iteration performed on at least some of the memory cells beyond the plurality of iterations of the program operation.

According to an aspect, the method further includes the step of performing the additional verify iteration using an additional verify voltage less than one of a plurality of verify voltages VCG_XV associated with a targeted one of the plurality of data states being programmed by a predetermined delta amount ΔVCG_EPT. In more detail, and as discussed, the predetermined delta amount ΔVCG_EPT may be in a range of approximately 0.3 volts to 0.5 volts. Again, the additional verify iteration may only be performed on the word lines of the slowest plane. Thus, according to an aspect, the method further includes the step of performing the additional verify iteration on the memory cells connected to the one of the plurality of word lines of the first plane.

Referring now to FIG. 16 specifically, the method can further include the step of 1600 beginning programming one of the plurality of pages of memory cells. Next, 1602 setting a current predetermined number of the plurality of iterations as an initial predetermined number of the plurality of iterations. Again, according to an aspect, the initial predetermined number of the plurality of iterations is equal to two. The method continues with the step of 1604 programming the memory cells of the one of the plurality of pages in the first plane and the second plane to the targeted one of the plurality of data states being programmed using one of a plurality of program pulses of one of the plurality of iterations. The method also includes the step of 1606 determining whether the memory cells of the one of the plurality of pages in the first plane and the second plane are verified for the targeted one of the plurality of data states being programmed. The method proceeds by 1608 determining whether the targeted one of the plurality of data states being programmed is the last one of the plurality of data states being programmed in response to determining the memory cells of the one of the plurality of pages in the first plane and the second plane are verified for the targeted one of the plurality of data states being programmed. Next, 1610 changing the targeted one of the plurality of data states to a next one of the plurality of data states and returning to programming the memory cells of the one of the plurality of pages in the first plane and the second plane to the targeted one of the plurality of data states being programmed using the one of the plurality of iterations in response to determining the targeted one of the plurality of data states being programmed is not the last one of the plurality of data states being programmed. The method continues with the step of 1612 ending programming of the one of the plurality of pages of memory cells and change the one of the plurality of pages to a next one of the plurality of pages and return to begin programming one of the plurality of pages of memory cells in response to determining the targeted one of the plurality of data states being programmed is the last one of the plurality of data states being programmed.

According to additional aspects of the disclosure and still referring to FIG. 16, the method further can include the step of 1614 determining whether the memory cells of the one of the plurality of pages in the second plane are verified for the targeted one of the plurality of data states being programmed in response to determining the memory cells of the one of the plurality of pages in the first plane and the second plane are not verified for the targeted one of the plurality of data states being programmed. The method also includes 1616 changing the one of the plurality of iterations to a next one of the plurality of iterations and returning to programming the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the second plane are not verified for the targeted one of the plurality of data states being programmed. The method continues with the step of 1618 determining whether the first plane programs slower than the second plane by the current predetermined number of the plurality of iterations of the program operation in response to determining the memory cells of the one of the plurality of pages in the second plane are verified for the targeted one of the plurality of data states being programmed. The method proceeds by 1620 performing the additional verify iteration on the memory cells of the one of the plurality of pages in the first plane using the additional verify voltage in response to determining the first plane programs slower than the second plane by the current predetermined number of the plurality of iterations of the program operation. The method further includes the step of 1622 changing the one of the plurality of iterations to the next one of the plurality of iterations and returning to programming the memory cells of the one of the plurality of pages in the first plane and the second plane to the targeted one of the plurality of data states being programmed using the one of the plurality of program pulses of one of the plurality of iterations in response to determining the first plane does not program slower than the second plane by the current predetermined number of the plurality of iterations of the program operation. Next, 1624 determining whether the memory cells of the one of the plurality of pages in the first plane are verified using the additional verify voltage in the additional verify iteration. The method also includes the step of 1626 incrementing the current predetermined number of the plurality of iterations by one for the one of the plurality of pages and returning to programming the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the first plane are verified using the additional verify voltage in the additional verify iteration. In addition, the method includes the step of 1628 terminating programming of the first plane prior to completing programming of the first plane and returning to programming the memory cells of the one of the plurality of pages in the second plane to the targeted one of the plurality of data states being programmed using the one of the plurality of program pulses of one of the plurality of iterations in response to determining the memory cells of the one of the plurality of pages in the first plane are not verified using the additional verify voltage in the additional verify iteration.

The advantages of the memory apparatus and method disclosed herein with the smart EPT mode include, for example, a solution to the NPD DPPM escape issue from EPT implementations employing the additional verify iteration without overkilling good blocks. The techniques described in conjunction with the memory apparatus and method disclosed herein saves significant efforts on EPT loop finetuning during technology development, especially when there are different product trims. In addition, as discussed above, there is virtually no program time tPROG penalty for the smart EPT mode disclosed herein.

Clearly, changes may be made to what is described and illustrated herein without, however, departing from the scope defined in the accompanying claims. The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A memory apparatus, comprising:
memory cells each connected to one of a plurality of word lines and disposed in memory holes and configured to retain a threshold voltage corresponding to one of a plurality of data states, the memory holes arranged in rows comprising a plurality of strings, the plurality of strings grouped into a plurality of blocks comprising a first plane and a second plane; and
a control means coupled to the plurality of word lines and the memory holes and configured to:
program memory cells of the first plane and the second plane connected to one of the plurality of word lines using a plurality of iterations of a program operation,
terminate programming of the first plane prior to completing programming of the first plane in response to determining the first plane programs slower than the second plane by a predetermined number of the plurality of iterations of the program operation, and
adjust the predetermined number of the plurality of iterations based on an additional verify iteration performed on at least some of the memory cells beyond the plurality of iterations of the program operation.

2. The memory apparatus as set forth in claim 1, wherein the control means is further configured to perform the additional verify iteration using an additional verify voltage less than one of a plurality of verify voltages associated with a targeted one of the plurality of data states being programmed by a predetermined delta amount.

3. The memory apparatus as set forth in claim 2, wherein the predetermined delta amount is in a range of approximately 0.3 volts to 0.5 volts.

4. The memory apparatus as set forth in claim 2, wherein the control means is further configured to perform the additional verify iteration on the memory cells connected to the one of the plurality of word lines of the first plane.

5. The memory apparatus as set forth in claim 4, wherein the memory cells connected to each of the plurality of word lines in one of the plurality of strings comprises one of a plurality of pages of memory cells and the control means is further configured to:
begin programming one of the plurality of pages of memory cells;
set a current predetermined number of the plurality of iterations as an initial predetermined number of the plurality of iterations;
program the memory cells of the one of the plurality of pages in the first plane and the second plane to the targeted one of the plurality of data states being programmed using one of a plurality of program pulses of one of the plurality of iterations;

determine whether the memory cells of the one of the plurality of pages in the first plane and the second plane are verified for the targeted one of the plurality of data states being programmed;

determine whether the targeted one of the plurality of data states being programmed is a last one of the plurality of data states being programmed in response to determining the memory cells of the one of the plurality of pages in the first plane and the second plane are verified for the targeted one of the plurality of data states being programmed;

change the targeted one of the plurality of data states to a next one of the plurality of data states and return to program the memory cells of the one of the plurality of pages in the first plane and the second plane to the targeted one of the plurality of data states being programmed using the one of the plurality of iterations in response to determining the targeted one of the plurality of data states being programmed is not the last one of the plurality of data states being programmed; and end programming of the one of the plurality of pages of memory cells and change the one of the plurality of pages to a next one of the plurality of pages and return to begin programming one of the plurality of pages of memory cells in response to determining the targeted one of the plurality of data states being programmed is the last one of the plurality of data states being programmed.

6. The memory apparatus as set forth in claim 5, wherein the control means is further configured to:

determine whether the memory cells of the one of the plurality of pages in the second plane are verified for the targeted one of the plurality of data states being programmed in response to determining the memory cells of the one of the plurality of pages in the first plane and the second plane are not verified for the targeted one of the plurality of data states being programmed;

change the one of the plurality of iterations to a next one of the plurality of iterations and return to program the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the second plane are not verified for the targeted one of the plurality of data states being programmed;

determine whether the first plane programs slower than the second plane by the current predetermined number of the plurality of iterations of the program operation in response to determining the memory cells of the one of the plurality of pages in the second plane are verified for the targeted one of the plurality of data states being programmed;

perform the additional verify iteration on the memory cells of the one of the plurality of pages in the first plane using the additional verify voltage in response to determining the first plane programs slower than the second plane by the current predetermined number of the plurality of iterations of the program operation;

change the one of the plurality of iterations to the next one of the plurality of iterations and return to program the memory cells of the one of the plurality of pages in the first plane and the second plane to the targeted one of the plurality of data states being programmed using the one of the plurality of program pulses of one of the plurality of iterations in response to determining the first plane does not program slower than the second plane by the current predetermined number of the plurality of iterations of the program operation;

determine whether the memory cells of the one of the plurality of pages in the first plane are verified using the additional verify voltage in the additional verify iteration;

increment the current predetermined number of the plurality of iterations by one for the one of the plurality of pages and return to program the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the first plane are verified using the additional verify voltage in the additional verify iteration; and terminate programming of the first plane prior to completing programming of the first plane and return to program the memory cells of the one of the plurality of pages in the second plane to the targeted one of the plurality of data states being programmed using the one of the plurality of program pulses of one of the plurality of iterations in response to determining the memory cells of the one of the plurality of pages in the first plane are not verified using the additional verify voltage in the additional verify iteration.

7. The memory apparatus as set forth in claim 5, wherein the initial predetermined number of the plurality of iterations is equal to two.

8. A controller in communication with a memory apparatus including memory cells each connected to one of a plurality of word lines and disposed in memory holes and configured to retain a threshold voltage corresponding to one of a plurality of data states, the memory holes arranged in rows comprising a plurality of strings, the plurality of strings grouped into a plurality of blocks comprising a first plane and a second plane, the controller configured to:

instruct the memory apparatus to program memory cells of the first plane and the second plane connected to one of the plurality of word lines using a plurality of iterations of a program operation;

instruct the memory apparatus to terminate programming of the first plane prior to completing programming of the first plane in response to determining the first plane programs slower than the second plane by a predetermined number of the plurality of iterations of the program operation; and adjust the predetermined number of the plurality of iterations based on an additional verify iteration performed on at least some of the memory cells beyond the plurality of iterations of the program operation.

9. The controller as set forth in claim 8, wherein the controller is further configured to instruct the memory apparatus to perform the additional verify iteration using an additional verify voltage less than one of a plurality of verify voltages associated with a targeted one of the plurality of data states being programmed by a predetermined delta amount.

10. The controller as set forth in claim 9, wherein the predetermined delta amount is in a range of approximately 0.3 volts to 0.5 volts.

11. The controller as set forth in claim 9, wherein the controller is further configured to instruct the memory apparatus to perform the additional verify iteration on the memory cells connected to the one of the plurality of word lines of the first plane.

12. The controller as set forth in claim 11, wherein the memory cells connected to each of the plurality of word lines in one of the plurality of strings comprises one of a plurality of pages of memory cells and the controller is further configured to:
  begin programming one of the plurality of pages of memory cells;
  set a current predetermined number of the plurality of iterations as an initial predetermined number of the plurality of iterations;
  instruct the memory apparatus to program the memory cells of the one of the plurality of pages in the first plane and the second plane to the targeted one of the plurality of data states being programmed using one of a plurality of program pulses of one of the plurality of iterations;
  instruct the memory apparatus to determine whether the memory cells of the one of the plurality of pages in the first plane and the second plane are verified for the targeted one of the plurality of data states being programmed;
  determine whether the targeted one of the plurality of data states being programmed is a last one of the plurality of data states being programmed in response to determining the memory cells of the one of the plurality of pages in the first plane and the second plane are verified for the targeted one of the plurality of data states being programmed;
  change the targeted one of the plurality of data states to a next one of the plurality of data states and return to instruct the memory apparatus to program the memory cells of the one of the plurality of pages in the first plane and the second plane to the targeted one of the plurality of data states being programmed using the one of the plurality of iterations in response to determining the targeted one of the plurality of data states being programmed is not the last one of the plurality of data states being programmed; and
  end programming of the one of the plurality of pages of memory cells and change the one of the plurality of pages to a next one of the plurality of pages and return to begin programming one of the plurality of pages of memory cells in response to determining the targeted one of the plurality of data states being programmed is the last one of the plurality of data states being programmed.

13. The controller as set forth in claim 12, wherein the controller is further configured to:
  instruct the memory apparatus to determine whether the memory cells of the one of the plurality of pages in the second plane are verified for the targeted one of the plurality of data states being programmed in response to determining the memory cells of the one of the plurality of pages in the first plane and the second plane are not verified for the targeted one of the plurality of data states being programmed;
  change the one of the plurality of iterations to a next one of the plurality of iterations and return to instruct the memory apparatus to program the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the second plane are not verified for the targeted one of the plurality of data states being programmed;
  determine whether the first plane programs slower than the second plane by the current predetermined number of the plurality of iterations of the program operation in response to determining the memory cells of the one of the plurality of pages in the second plane are verified for the targeted one of the plurality of data states being programmed;
  instruct the memory apparatus to perform the additional verify iteration on the memory cells of the one of the plurality of pages in the first plane using the additional verify voltage in response to determining the first plane programs slower than the second plane by the current predetermined number of the plurality of iterations of the program operation;
  change the one of the plurality of iterations to the next one of the plurality of iterations and return to instruct the memory apparatus to program the memory cells of the one of the plurality of pages in the first plane and the second plane to the targeted one of the plurality of data states being programmed using the one of the plurality of program pulses of one of the plurality of iterations in response to determining the first plane does not program slower than the second plane by the current predetermined number of the plurality of iterations of the program operation;
  instruct the memory apparatus to determine whether the memory cells of the one of the plurality of pages in the first plane are verified using the additional verify voltage in the additional verify iteration;
  increment the current predetermined number of the plurality of iterations by one for the one of the plurality of pages and return to instruct the memory apparatus to program the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the first plane are verified using the additional verify voltage in the additional verify iteration; and
  terminate programming of the first plane prior to completing programming of the first plane and return to instruct the memory apparatus to program the memory cells of the one of the plurality of pages in the second plane to the targeted one of the plurality of data states being programmed using the one of the plurality of program pulses of one of the plurality of iterations in response to determining the memory cells of the one of the plurality of pages in the first plane are not verified using the additional verify voltage in the additional verify iteration.

14. A method of operating a memory apparatus including memory cells each connected to one of a plurality of word lines and disposed in memory holes and configured to retain a threshold voltage corresponding to one of a plurality of data states, the memory holes arranged in rows comprising a plurality of strings, the plurality of strings grouped into a plurality of blocks comprising a first plane and a second plane, the method comprising the steps of:
  programming memory cells of the first plane and the second plane connected to one of the plurality of word lines using a plurality of iterations of a program operation;

terminating programming of the first plane prior to completing programming of the first plane in response to determining the first plane programs slower than the second plane by a predetermined number of the plurality of iterations of the program operation; and adjusting the predetermined number of the plurality of iterations based on an additional verify iteration performed on at least some of the memory cells beyond the plurality of iterations of the program operation.

15. The method as set forth in claim 14, further including the step of performing the additional verify iteration using an additional verify voltage less than one of a plurality of verify voltages associated with a targeted one of the plurality of data states being programmed by a predetermined delta amount.

16. The method as set forth in claim 15, wherein the predetermined delta amount is in a range of approximately 0.3 volts to 0.5 volts.

17. The method as set forth in claim 15, further including the step of performing the additional verify iteration on the memory cells connected to the one of the plurality of word lines of the first plane.

18. The method as set forth in claim 15, wherein the memory cells connected to each of the plurality of word lines in one of the plurality of strings comprises one of a plurality of pages of memory cells and the method further includes the steps of:

beginning programming one of the plurality of pages of memory cells;

setting a current predetermined number of the plurality of iterations as an initial predetermined number of the plurality of iterations;

programming the memory cells of the one of the plurality of pages in the first plane and the second plane to the targeted one of the plurality of data states being programmed using one of a plurality of program pulses of one of the plurality of iterations;

determining whether the memory cells of the one of the plurality of pages in the first plane and the second plane are verified for the targeted one of the plurality of data states being programmed;

determining whether the targeted one of the plurality of data states being programmed is a last one of the plurality of data states being programmed in response to determining the memory cells of the one of the plurality of pages in the first plane and the second plane are verified for the targeted one of the plurality of data states being programmed;

changing the targeted one of the plurality of data states to a next one of the plurality of data states and returning to programming the memory cells of the one of the plurality of pages in the first plane and the second plane to the targeted one of the plurality of data states being programmed using the one of the plurality of iterations in response to determining the targeted one of the plurality of data states being programmed is not the last one of the plurality of data states being programmed; and ending programming of the one of the plurality of pages of memory cells and change the one of the plurality of pages to a next one of the plurality of pages and return to begin programming one of the plurality of pages of memory cells in response to determining the targeted one of the plurality of data states being programmed is the last one of the plurality of data states being programmed.

19. The method as set forth in claim 18, further including the steps of:

determining whether the memory cells of the one of the plurality of pages in the second plane are verified for the targeted one of the plurality of data states being programmed in response to determining the memory cells of the one of the plurality of pages in the first plane and the second plane are not verified for the targeted one of the plurality of data states being programmed;

changing the one of the plurality of iterations to a next one of the plurality of iterations and returning to programming the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the second plane are not verified for the targeted one of the plurality of data states being programmed;

determining whether the first plane programs slower than the second plane by the current predetermined number of the plurality of iterations of the program operation in response to determining the memory cells of the one of the plurality of pages in the second plane are verified for the targeted one of the plurality of data states being programmed;

performing the additional verify iteration on the memory cells of the one of the plurality of pages in the first plane using the additional verify voltage in response to determining the first plane programs slower than the second plane by the current predetermined number of the plurality of iterations of the program operation;

changing the one of the plurality of iterations to the next one of the plurality of iterations and returning to programming the memory cells of the one of the plurality of pages in the first plane and the second plane to the targeted one of the plurality of data states being programmed using the one of the plurality of program pulses of one of the plurality of iterations in response to determining the first plane does not program slower than the second plane by the current predetermined number of the plurality of iterations of the program operation;

determining whether the memory cells of the one of the plurality of pages in the first plane are verified using the additional verify voltage in the additional verify iteration;

incrementing the current predetermined number of the plurality of iterations by one for the one of the plurality of pages and returning to programming the memory cells of the one of the plurality of pages in the first plane and the second plane to the targeted one of the plurality of data states being programmed using the one of the plurality of program pulses of one of the plurality of iterations in response to determining the memory cells of the one of the plurality of pages in the first plane are verified using the additional verify voltage in the additional verify iteration; and terminating programming of the first plane prior to completing programming of the first plane and returning to programming the memory cells of the one of the plurality of pages in the second plane to the targeted one of the plurality of data states being programmed using the one of the plurality of program pulses of one of the plurality of iterations in response to determining the memory cells of the one of the plurality of pages in the first plane are not verified using the additional verify voltage in the additional verify iteration.

20. The method as set forth in claim 19, wherein the initial predetermined number of the plurality of iterations is equal to two.

* * * * *